(12) United States Patent
Bachalo et al.

(10) Patent No.: US 10,705,001 B2
(45) Date of Patent: *Jul. 7, 2020

(54) PARTICLE FIELD IMAGING AND CHARACTERIZATION USING VCSEL LASERS FOR CONVERGENT MULTI-BEAM ILLUMINATION

(71) Applicant: Artium Technologies, Inc., Sunnyvale, CA (US)

(72) Inventors: William D. Bachalo, Los Altos Hills, CA (US); Gregory A. Payne, Richland, WA (US); Khalid Ibrahim, Hatfield, PA (US); Michael J. Fidrich, San Jose, CA (US); Julien Manin, Livermore, CA (US)

(73) Assignee: Artium Technologies, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/959,717

(22) Filed: Apr. 23, 2018

(65) Prior Publication Data

US 2019/0323938 A1 Oct. 24, 2019

(51) Int. Cl.
*G01N 15/02* (2006.01)
*H01S 5/42* (2006.01)
*H01S 5/068* (2006.01)

(52) U.S. Cl.
CPC ..... *G01N 15/0227* (2013.01); *H01S 5/06804* (2013.01); *H01S 5/423* (2013.01)

(58) Field of Classification Search
CPC .............. G01N 15/0227; G01N 15/03; G01N 15/0205; G01N 15/1459;
(Continued)

(56) References Cited

U.S. PATENT DOCUMENTS

| 6,081,577 A | * | 6/2000 | Webber | ............... G01N 23/046 378/23 |
| 7,733,485 B2 | | 6/2010 | Sandler et al. | |

(Continued)

FOREIGN PATENT DOCUMENTS

| CN | 2729694 Y | 9/2005 |
| CN | 101292150 A | 10/2008 |
| WO | 2017060164 A1 | 4/2017 |

OTHER PUBLICATIONS

PCT International Search Report for PCT/US2019/028781 dated Jul. 25, 2019, 4 pages.

(Continued)

*Primary Examiner* — Sang H Nguyen
(74) *Attorney, Agent, or Firm* — Womble Bond Dickinson (US) LLP

(57) ABSTRACT

An apparatus to provide multi-beam imaging of particles includes a plurality of vertical cavity surface emitting lasers (VCSELs) configured to generate a plurality of light beams that converge with each other to form a measurement volume within a particle field. The plurality of the VCSELs are configured to provide uniformity in a background illumination of the measurement volume. An imaging optics is coupled to at least one of the plurality of VCSELs. A digital camera is coupled to the imaging optics to obtain a shadow image of a particle passing through the measurement volume at a focal plane of the digital camera. A processor is coupled to the digital camera.

29 Claims, 22 Drawing Sheets

(58) Field of Classification Search
CPC ... G01N 2015/1075; G01N 2015/0294; G01N 2015/03; G01N 21/85

See application file for complete search history.

(56) References Cited

U.S. PATENT DOCUMENTS

| | | | |
|---|---|---|---|
| 8,194,170 | B2 | 6/2012 | Golub et al. |
| 8,477,307 | B1 | 7/2013 | Yufa et al. |
| 8,681,251 | B2 | 3/2014 | Kim et al. |
| 2002/0108859 | A1* | 8/2002 | Wang ................ B07C 5/34 204/547 |
| 2002/0111546 | A1 | 8/2002 | Cook et al. |
| 2003/0122054 | A1* | 7/2003 | Wilson ................ G01P 3/36 250/206.1 |
| 2004/0160998 | A1* | 8/2004 | Gruhlke ............ G06F 3/0317 372/29.021 |
| 2005/0046821 | A1* | 3/2005 | Hanson .............. G01P 3/366 356/3.01 |
| 2006/0019247 | A1* | 1/2006 | Su .................... C12Q 1/6869 435/6.17 |
| 2006/0175561 | A1* | 8/2006 | Estevadeordal ...... G01F 1/704 250/573 |
| 2007/0086918 | A1* | 4/2007 | Hartley ............ G01N 15/1484 422/73 |
| 2007/0273957 | A1 | 11/2007 | Zalevsky et al. |
| 2008/0049231 | A1* | 2/2008 | Bachalo ........... G01N 15/1459 356/484 |
| 2009/0075248 | A1* | 3/2009 | Debreczeny ........ G01N 15/06 435/3 |
| 2010/0302396 | A1 | 12/2010 | Golub et al. |
| 2013/0194787 | A1 | 8/2013 | Geske et al. |
| 2013/0342684 | A1* | 12/2013 | Keranen ........... G01N 15/0227 348/135 |
| 2015/0300938 | A1* | 10/2015 | Debreczeny ......... G01N 21/51 356/343 |
| 2015/0362585 | A1 | 12/2015 | Ghosh et al. |
| 2016/0352073 | A1 | 12/2016 | Dummer et al. |
| 2017/0038299 | A1* | 2/2017 | Long ................ G01N 21/6408 |
| 2018/0045634 | A1* | 2/2018 | Bachalo ............ G01N 15/0205 |

OTHER PUBLICATIONS

PCT Written Opinion of the International Searching Authority for PCT/US2019/028781 dated Jul. 25, 2019, 9 pages.

Bachalo, W., "Method for measuring the size and velocity of spheres by dual-beam light-scatter interferometry," Applied Optics, Feb. 1, 1980, pp. 363-370, vol. 19, No. 3, Optical Society of America.

Bachalo, et al, "Phase/Doppler spray analyzer for simultaneous measurements of drop size and velocity distributions," Optical Engineering, Sep./Oct. 1984, pp. 583-590, vol. 23, No. 5, Society of Photo-Optical Instrumentation Engineers.

Bachalo, et al., "37: Phase Doppler Particle Analyzer," The Handbook of Fluid Dynamics, 1998, 21 pgs., CRC Press.

Brenguier, et al., "Improvements of Droplet Size Distribution Measurements with the Fast-FSSP (Forward Scattering Spectrometer Probe)," Journal of Atmospheric and Oceanic Technology, Oct. 1998, pp. 1077-1090, vol. 15, American Meteorological Society.

Cober, et al., "Characterizations of Aircraft icing Environments that Include Supercooled Large Drops," Journal of Applied Meteorology, Nov. 2001, pp. 1984-2002, vol. 40, American Meteorological Society.

Hardalupas, et al., "A Shadow Doppler technique for sizing particles of arbitrary shape," 3rd Congress on Optical Particle Sizing, 1993, 10 pgs., Yokohama, Japan.

Kim, et al., "Drop Sizing and Depth-of-Field Correction in TV Imaging," Atomization and Sprays, 1994, pp. 65-78, vol. 4, Begell House, Inc.

Korolev, et al., "Evaluation of Measurements of Particle Size and Sample Area from Optical Array Probes," Journal of Atmospheric and Oceanic Technology, 1991, pp. 514-522, vol. 8, American Meteorological Society.

Korolev, et al., "Evaluation of the Accuracy of PMS Optical Array Probes," Journal of Atmospheric and Oceanic Technology, 1998, 13 pgs., vol. 15, No. 3.

Lebrun, et al., "Methods for the deconvolution of defocused-image pairs recorded separately on two CCD cameras: application to particle sizing," Applied Optics, Nov. 10, 1996, pp. 6375-3681, vol. 35, No. 32, Optical Society of America.

Lecuona, et al., "Volumetric Characterization of Dispersed Two-Phase Flows by Digital Image Analysis," Measurement Science and Technology, 2000, pp. 1152-1161, vol. 11, IOP Publishing Ltd.

Lee, et al., "Sizing of Spray Particles Using Image Processing Technique," KSME International Journal, 2004, pp. 879-894, vol. 18, No. 6.

Maeda, et al., "Accuracy of Particle Flux and Concentration Measurement by Shadow Doppler Velocimetry," Developments in Laser Techniques and Fluid Mechanics, 1997, pp. 233-257, Springer-Verlag Berlin Heidelberg.

Malot, et al., "Droplet Size Distribution and Sphericity Measurements of Low-Density Sprays Through Image Analysis," Particle & Particle Systems Characterization, 2000, pp. 146-158, vol. 17, Wiley-VCH Verlag GmbH, D-69469 Weinheim.

Morikita, et al "Measurement of Size and Velocity of Arbitrary Shaped Particles by LDA Based Shadow Image Technique," Developments in Laser Techniques and Fluid Mechanics, 1996, pp. 354-375, Springer-Verlag Berlin Heidelberg.

Oldenburg, et al., "Comparison of Two Droplet Sizing Systems in an Icing Wind Tunnel," 28th Aerospace Sciences Meeting, Jan. 8-11, 1990, 20 pgs., Technical Memorandum 102456, American Institute of Aeronautics and Astronautics.

Rudoff, et al., "Performance of the Phase Doppler Particle Analyzer Icing Cloud Droplet Sizing Probe in the NASA Lewis Icing Research Tunnel," 30th Aerospace Sciences Meeting & Exhibit, Jan. 6-9, 1992, 15 pgs., AIAA 92/0162, Reno, Nevada.

Rudoff, et al., "Liquid Water Content Measurements Using the Phase Doppler Particle Analyzer in the NASA Lewis Icing Research Tunnel," 31st Aerospace Sciences Meeting & Exhibit, Jan. 11-14, 1993, 17 pgs., AIAA 93-0298, Reno, Nevada.

Strapp, et al., "Laboratory Measurements of the Response of a PMS OAP-2DC," Journal of Atmospheric and Oceanic Technology, Jul. 2001, pp. 1150-1170, vol. 18, American Meteorological Society.

The Chinese Office Action for Application No. 201680022730.9 dated Aug. 5, 2019, 20 pages, [English Translation].

The Final Office Action for U.S. Appl. No. 15/552,263 dated Feb. 6, 2019, 9 pages.

The International Preliminary Report on Patentability for PCT Application No. PCT/US2016/018352 dated Aug. 22, 2017, 6 pages.

The International Search Report and Written Opinion of the International Searching Authority for PCT Application No. PCT/US2016/018352 dated Jun. 1, 2016, 9 pages.

The Non-Final Office Action for U.S. Appl. No. 15/552,263 dated Sep. 19, 2018, 6 pages.

The Notice of Allowance for U.S. Appl. No. 15/552,263 dated Jun. 7, 2019, 7 pages.

The Notice of Allowance for U.S. Appl. No. 15/552,263 dated Oct. 18, 2019, 7 pages.

The Search Report for Chinese Application No. 2016800227309 dated Jul. 22, 2019, 2 pages, [English Translation Only].

Wang, et al., "High speed stereoscopic shadowgraph imaging and its digital 3D reconstruction," Measurement Science and Technology, 2011, 9 pgs., vol. 22, IOP Publishing.

Zimmerman, et al., "PSI: An innovative method to determine and to classify particles during the thermal spray process," 35th International Conference on Plasma Science, Jun. 15-19, 2008, IEEE.

Preliminary Amendment filed Aug. 18, 2017 for U.S. Appl. No. 15/552,263, 3 pages.

Preliminary Amendment filed Feb. 11, 2020 for U.S. Appl. No. 16/788,111, 10 pages.

Issue Notification dated Feb. 12, 2020 for U.S. Appl. No. 15/552,263, 1 page.

Amendment filed Jan. 22, 2019 for U.S. Appl. No. 15/552,263, 17 pages.

(56) References Cited

OTHER PUBLICATIONS

Amendment filed Apr. 25, 2019 for U.S. Appl. No. 15/552,263, 16 pages.

* cited by examiner

| Parameter | Time [ns] |
|---|---|
| Rise time | 19 |
| Fall time | 7 |
| Duration (50 ns) | 43 |
| Duration (100 ns) | 93 |
| Duration (200 ns) | 193 |

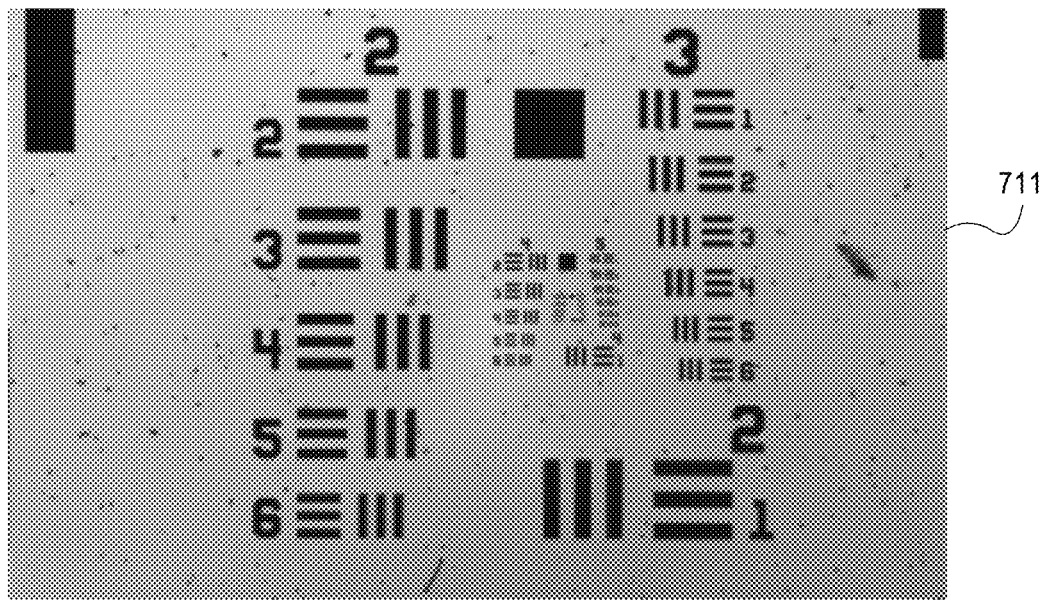
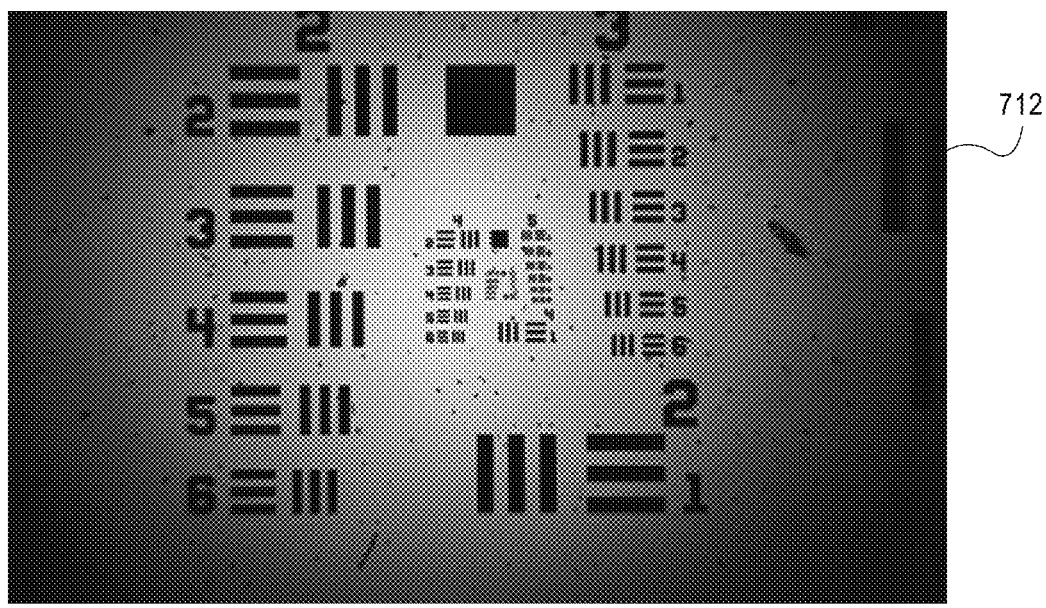
FIG. 7B

1500

```
┌─────────────────────────────────────────────────────────────┐
│ GENERATING A PLURALITY OF LIGHT BEAMS PROPAGATING THROUGH A │
│ PARTICLE FIELD USING A PLURALITY OF VERTICAL CAVITY SURFACE │
│ EMITTING LASERS, THE PLURALITY OF ILLUMINATING LIGHT BEAMS  │
│ CONVERGING WITH EACH OTHER TO FORM A MEASUREMENT VOLUME     │
│ WITHIN THE PARTICLE FIELD, WHEREIN THE PLURALITY OF VERTICAL│
│ CAVITY SURFACE EMITTING LASERS ARE CONFIGURED TO PROVIDE    │
│ UNIFORMITY IN A BACKGROUND ILLUMINATION OF THE MEASUREMENT  │
│                          VOLUME                             │
│                           1501                              │
└─────────────────────────────────────────────────────────────┘
                              │
                              ▼
┌─────────────────────────────────────────────────────────────┐
│            MONITORING THE BACKGROUND ILLUMINATION           │
│                           1502                              │
└─────────────────────────────────────────────────────────────┘
                              │
                              ▼
┌─────────────────────────────────────────────────────────────┐
│    ADJUSTING AT LEAST ONE OF THE PLURALITY OF VERTICAL CAVITY│
│       SURFACE EMITTING LASERS BASED ON MONITORING           │
│                           1503                              │
└─────────────────────────────────────────────────────────────┘
                              │
                              ▼
┌─────────────────────────────────────────────────────────────┐
│ DETERMINING A SHADOW IMAGE OF A PARTICLE PASSING THROUGH THE│
│  MEASUREMENT VOLUME AT A FOCAL PLANE OF A DIGITAL CAMERA    │
│                     BASED ON ADJUSTING                      │
│                           1504                              │
└─────────────────────────────────────────────────────────────┘
```

FIG. 15

PARTICLE FIELD IMAGING AND CHARACTERIZATION USING VCSEL LASERS FOR CONVERGENT MULTI-BEAM ILLUMINATION

GOVERNMENT LICENSE RIGHTS

This invention was made with government support under Contract No. NNX17CC02C awarded by National Aeronautics and Space Administration (NASA). The government has certain rights in the invention.

CROSS-REFERENCE TO RELATED APPLICATIONS

This patent application is related to a U.S. patent application Ser. No. 15/552,263 filed on Aug. 18, 2017 that is a U.S. National Phase application under 35 U.S.C. § 371 of International Application No. PCT/US2016/018352, filed on Feb. 17, 2016, entitled MULTIPLE BEAM AND CONVERGENT LIGHT ILLUMINATION CROSSED-BEAM IMAGING, which claims the benefit of priority from U.S. Provisional Application No. 62/118,962, filed on Feb. 20, 2015.

FIELD

Embodiments of the invention relate to particle imaging. More particularly, embodiments of the invention relate to imaging of particles using convergent light.

BACKGROUND

A very wide range of industrial processes use liquid droplets and solid particles of irregular shapes and sizes. Grinding powders, medical inhalers, and spray painting are just a few such examples. Industrial processes including coatings produced by thermal and other sprays typically involve determinations of particle parameters—for example, particle size, shape, velocity, and position in space. The area of aircraft icing involves supercooled water droplets in the presence of ice crystals and ice particles (spherical frozen droplets). Existing techniques may not accurately and reliably measure the size of these particles. Furthermore, existing techniques may not be able to separate the liquid droplets from the ice particles and ice crystals. Under dense spray and ice crystal conditions, existing methods have difficulty with light beam obscuration which results in a loss of information.

Existing particle imaging techniques include incorporating bright-field imaging using arc flash lamps, pulsed lasers, and pulsed LEDs for illumination. These techniques typically use charge-coupled device ("CCD") cameras or Complementary Metal Oxide Semiconductor ("CMOS") cameras to record the shadow images of the particles. These techniques typically use collimated or nearly collimated light with diffusers to illuminate the particle field. In these techniques, however, the out of focus particles under relatively dense particle field conditions typically produce shadows that complicate the detection and measurement of the in focus particle shadow images. In addition, larger particles in the light beam path can extinguish or obscure the light beam which causes a loss of the smaller particle image at the sample volume. Such losses of images result in an unacceptable bias in the sampling statistics.

Typically, the lasers used for the particle imaging techniques are edge emitting laser diodes. The edge emitting laser diodes are generally made up of cleaved bars diced from the wafers. As a result of the high index of refraction between air and the semiconductor material, the cleaved bars facets act as mirrors. For the edge emitting laser diodes, light oscillates parallel to the active layers and escapes sideways resulting in an elliptical laser beam profile.

Unfortunately, the lasers used for the existing particle imaging techniques are at least partially coherent and monochromatic and thus produce visible diffraction rings around features and speckle. The diffraction rings and the speckle of laser radiation are detrimental to line-of-sight microscopy. Speckle and diffraction of laser radiation degrade an image quality and the background light intensity distribution that becomes noisy and non-uniform.

SUMMARY

Methods and apparatuses to provide multi-beam imaging of particles are described. For one embodiment, an apparatus to provide multi-beam imaging of particles includes a plurality of vertical cavity surface emitting lasers (VCSELs) configured to generate a plurality of light beams that converge with each other to form a measurement volume within a particle field. The plurality of the VCSELs is configured to provide uniformity in a background illumination of the measurement volume. Imaging optics are coupled to at least one of the plurality of VCSELs. A digital camera is coupled to the imaging optics to obtain a shadow image of a particle passing through the measurement volume at a focal plane of the digital camera. A processor is coupled to the digital camera.

For one embodiment, a plurality of light beams that converge with each other to form a measurement volume within a particle field are generated using a plurality of vertical cavity surface emitting lasers to provide uniformity in a background illumination of the measurement volume. A shadow image of a particle passing through the measurement volume at a focal plane of a digital camera is obtained.

For an embodiment, a non-transitory machine-readable medium comprises data that when accessed by a data processing system, cause the data processing system to perform a method to image particles that includes generating a plurality of light beams that converge with each other to form a measurement volume within a particle field using a plurality of vertical cavity surface emitting lasers to provide uniformity in a background illumination of the measurement volume, and obtaining a shadow image of a particle passing through the measurement volume at a focal plane of a first digital camera.

Other features and advantages of embodiments of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements, in which:

FIG. 7B is a view showing a resolution chart captured by a long distance microscope when a scene is illuminated by a LED source and a resolution chart captured by the long distance microscope when the scene is illuminated by a VCSEL source according to one embodiment.

FIG. 15 shows a flow chart of a method to provide multi-beam imaging of particles according to another embodiment.

DETAILED DESCRIPTION

Methods and apparatuses to provide multi-beam imaging of particles using a plurality of vertical cavity surface emitting lasers are described. It should be noted that term "particle" is referred herein to a droplet, a bubble, or any other object. The particle can have a spherical shape, a deformed sphere shape, or any other shape. The particle can comprise a liquid, a solid material, a bubble, or any combination thereof.

For one embodiment, an apparatus to image particles includes a plurality of vertical cavity surface emitting lasers (VCSELs) to generate a plurality of light beams propagating through a particle field. The plurality of the VCSELs converge with each other to form a measurement volume within the particle field. The plurality of the VCSELs is configured to provide uniformity in a background illumination of the measurement volume. An imaging optics is coupled to at least one of the plurality of VCSELs. A digital camera is coupled to the imaging optics to obtain a shadow image of a particle passing through the measurement volume at a focal plane of the digital camera. A processor is coupled to the digital camera. The VCSEL light sources are used for multi-beam imaging of particles to provide high quality illumination that is uniform and free of laser speckle. VCSELs have lower manufacturing costs and are highly reliable as compared to edge emitting laser diodes. Currently, VCSELs are only used in data communication, local-area networks and face recognition systems.

Typically, the laser diodes used as an illumination source for imaging techniques have laser-specific characteristics, e.g., diffraction and speckle that degrade image quality. The use of an array of VCSELs for particle multi-beam imaging advantageously decreases diffraction and speckle and increases uniformity of the background illumination of the particle measurement volume comparing to existing techniques.

Figure 1:
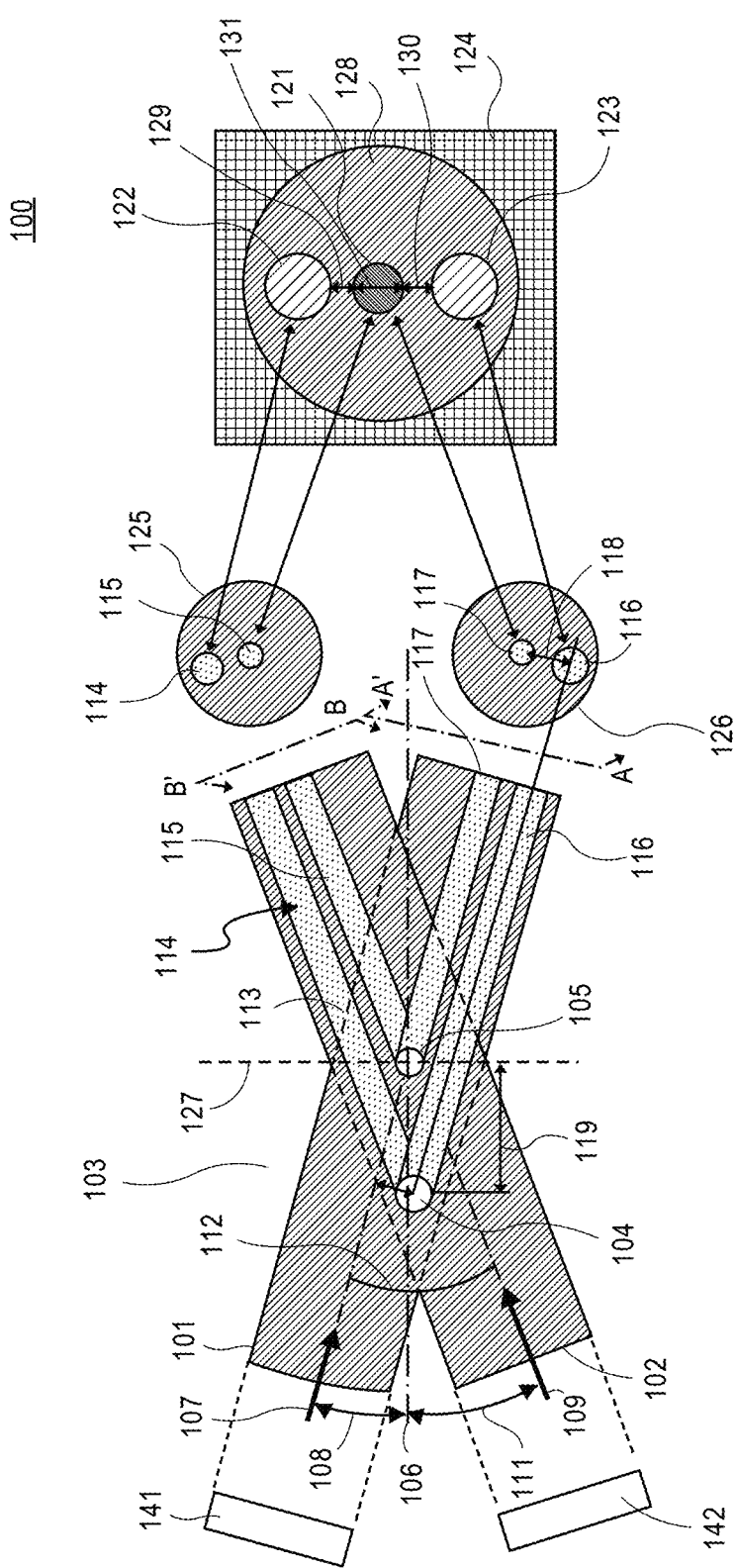
FIG. 1 shows a schematic of one embodiment of an apparatus to provide multi-beam imaging using a plurality of vertical cavity surface emitting laser sources (VCSELs).

FIG. 1 shows a schematic of one embodiment of an apparatus 100 to provide multi-beam imaging using a plurality of vertical cavity surface emitting laser sources (VCSELs). Apparatus 100 comprises a plurality of VCSEL sources—e.g., a VCSEL source 141 and a VCSEL source 142—to generate a plurality of illuminating light beams—e.g., a VCSEL source 141 is configured to generate an illuminating light beam 101 and a VCSEL source 142 is configured to generate an illuminating light beam 102—that converge with each other to form a measurement volume 113 within a particle field 103 to provide uniformity in illumination of a background 128 on an image plane 124 of an imaging system that is associated with the measurement volume 113 and to remove out of focus shadows in image plane 124. As shown in FIG. 1, the illumination light intensity produced by the converging light beams of the VCSEL sources 141 and 142 at different locations on the background 128 is similar, so that the light intensity distribution across the entire background 128 is uniform. For one embodiment, the illumination of the background 128 is substantially free of speckles and diffraction patterns, as described in further detail below. Imaging optics are coupled to at least one of the plurality of vertical cavity surface emitting lasers, as described in further detail below. A digital camera is coupled to the imaging optics to obtain a shadow image of a particle passing through the measurement volume 113 at a focal plane 127 of the digital camera, as described in further detail below. A processor is coupled to the digital camera, as described in further detail below.

For one embodiment, each of the plurality of converging light beams 101 and 102 is generated by at least two VCSELs. For one embodiment, each of the VCSEL sources 141 and 142 includes an array of VCSELs. For one embodiment, at least some of the VCSELs generating the plurality of converging light beams 101 and 102 are a part of a vertical cavity surface emitting laser array, as described in further detail below. For one embodiment, an array of VCSELs is configured to generate at least one of the plurality of converging light beams 101 and 102. For one embodiment, the array of VCSELs that is configured to generate at least one of the converging light beams 101 and 102 includes at least six VCSELs. For one embodiment, at least one of the light beams 101 and 102 is generated by the array of VCSELs that are arranged in a circular pattern, as described in further detail below.

As shown in FIG. 1, illuminating light beam 101 propagates on an optical path along a direction 107 and illuminating light beam 102 propagates on an optical path along a direction 109 through a particle field 103. The optical path of beam 101 is different from the optical path of beam 102. For one embodiment, illuminating light beams 101 and 102 have the same wavelength. For one embodiment, the wavelength of the illuminating light beams 101 and 102 is about 840 nm. For one embodiment, at least one of the illuminating light beams 101 and 102 generated by VCSELs is a pulsed beam. For one embodiment, at least one of the pulsed illuminating light beams 101 and 102 generated by the VCSELs for multi-beam imaging of particles has a fast rise time on the order of 200 picoseconds (ps), as described in further detail below. For one embodiment, the beams are pulsed in unison to "freeze" the particle motion, as described in further detail below.

For an embodiment, at least two illuminating beams crossing at a common point to form the measurement volume are used to image particles. For more specific embodiment, a number of illuminating light beams converging at a common point to form the measurement volume to image the particles is in an approximate range from 2 to 12.

For one embodiment, the VCSEL sources for multi-beam imaging of particles are configured to have a very short coherence length that is similar to that of the light emitting diodes (LEDs) that minimizes laser speckle. For one embodiment, the VCSEL arrays for the multi-beam imaging of particles have an output power in an approximate range from about 500 milliwatt (mW) to 5 Watts (W). For one embodiment, the VCSEL arrays for the multi-beam imaging of particles have an output power of about 5 W.

For one embodiment, each of the plurality of light beams 101 and 102 produced by the VCSELs has a full beam divergence angle that is not greater than 7 degrees. For one embodiment, each of the plurality of light beams 101 and 102 produced by the VCSELs has a power that is at least 250 milliwatt (mW). For one embodiment, the VCSELs of the multi-beam particle imaging system output about 7 W under continuous operation, and over 10 W peak power under pulsed operation.

For one embodiment, VCSEL array chips are configured to replace traditional LEDs used for as illuminators with silicon CCD or CMOS cameras. An advantage of the VCSELs over the LEDs is that the divergence angle of the VCSEL beam is substantially smaller than the divergence angle of the LED beam. For one embodiment, the full divergence angle of the VCSEL beam is only about 16 degrees. For one embodiment, the full divergence angle of the VCSEL beam is about 5 degrees which is ideal for long range applications such as for the modular imaging (HSI). Typically, the modular imaging refers to the use of a separate transmitting component including the VCSEL illumination system and a separate receiving component including the digital camera recording components (CCD, CMOS). This approach allows separation of the material components further from the measurement location to avoid disturbance of the sample to be measured.

For one embodiment, the speckle of the one or more VCSEL sources used for multi-beam imaging of particles is less than 5% to increase uniformity of background illumination comparing to conventional systems. For one embodiment, the background illumination provided by the multiple light beams generated by the VCSELs for multi-beam imaging of particles is substantially free of speckle and diffraction pattern noise.

The VCSELs are more eye-safe than edge emitting lasers for multi-beam imaging of particles, especially if used with diffusors to further homogenize the beams. An added advantage is that the VCSEL devices are much more powerful than edge emitting lasers and have intense collimated light beams. Although the VCSEL devices produce very high intensity light beams, the character of the light beams is more along the lines of the LED than a laser. For one embodiment, the VCSEL source used for multi-beam imaging of particles is advantageously arranged in a simple silica integrated circuit (IC) chip-like configuration that provides ease of mounting and compactness.

The VCSEL devices have a number of advantages over edge emitting laser diodes including their ability to operate at relatively high temperatures so cooling systems are not required. For aircraft icing applications, the VCSEL may be in an environment close to the probe heaters so the temperature insensitivity is important. The VCSELs can deliver very high power per unit area reaching approximately 1200 W/cm$^2$. The VCSELs emit a circular beam which can be designed to have a Gaussian intensity distribution. This simplifies the optics needed for transforming the beam to a near top hat intensity distribution using, for example, diffractive optical elements (DOEs). VCSEL lasers are more reliable than edge emitting laser diodes. Typical failures are predicted to be 1 billion device hours (estimated Mean Time To Failure (MTTF) is about 100 years). In terms of pricing, VCSELs are approaching the price of LEDs. VCSELs can be processed easily into monolithic 2D arrays when higher power is required.

For another embodiment, the illuminating light beams for convergent multi-beam illumination of particles are produced by a plurality of vertical cavity surface emitting lasers (VCSELs), light emitting diodes ("LEDs"), other lasers, or any combination thereof.

As shown in FIG. 1, the particle field 103 comprises particles, such as a particle 104 and 105. Illuminating light beam 101 and illuminating light beam 102 converge with each other to form measurement volume 113. As shown in FIG. 1, measurement volume 113 is a region where light beams 101 and 102 overlap with each other. The beam 101 is at an angle 108 to an optical axis 106. The beam 102 is at an angle 111 to optical axis 106. For an embodiment, if one of the angles 108 and 111 is a 0 degree angle, the other one of the angles 108 and 111 can be any angle other than 0 degree. For one embodiment, the beam intersection angle is determined by an f-number (f #) of the imaging system. The f # is defined as a lens focal length divided by the lens diameter. For another embodiment, each beam is detected by a separate lens and the image transferred to a common image plane so that larger beam intersection angles can be used.

As shown in FIG. 1, illuminating light beams 101 and 102 intersect at an angle 112. For an embodiment, angle 112 is a sum of angles 108 and 111. Particle 105 passes a portion of the measurement volume 113 at a focal plane 127 of an imaging system that includes a digital camera and produces an individual shadow 115 along direction 109 of beam 102 and an individual shadow 117 along direction 107 of beam 101. Particle 104 passes a portion of the measurement volume 113 at a distance 119 away from focal plane 127 and produces an individual shadow 114 along direction 109 of beam 102 and an individual shadow 116 along direction 107 of beam 101.

A cross-sectional view 126 of a measurement volume 113 along an axis A-A' perpendicular to direction 107 comprises individual shadows 116 and 117. A cross-sectional view 125 of a measurement volume 113 along an axis B-B' perpendicular to direction 109 comprises individual shadows 114 and 115, as shown in FIG. 1. A shadow image 121 of particle 105 is formed on image plane 124 of an imaging system. Shadow image 121 is formed as a superposition of individual shadows 115 and 117. As shown in FIG. 1, shadow image 121 is substantially different from a background 128 produced by beams 102 and 101. An individual shadow image 122 is formed from individual shadow 114 and an individual shadow image 123 is formed from individual shadow 116 on image plane 124. The individual shadow images 122 and 123 of particle 104 do not overlap and are separated from each other and from shadow image 121 on image plane 124. For one embodiment, a contrast between the shadow image 121 and the background 128 is greater than a contrast between the shadow image 122 of particle 104 outside the focal plane 127 and the background 128. For one embodiment, the illumination intensities of the individual shadow images 122 and 123 of particle 104 are substantially the same as that of the background 128.

For one embodiment, the illumination intensity of the background 128 is monitored, and an intensity of at least one of the plurality of VCSELs is adjusted based on the monitored background illumination to obtain the shadow image 121. For one embodiment, a contrast between the shadow image 121 and the background 128 is measured. For one embodiment, it is determined if the measured contrast is greater than a predetermined contrast. If the measured contrast is greater than the predetermined contrast, the shadow image 121 is detected from the background 128. If the contrast is not greater than the predetermined contrast, the shadow image 121 is not detected from the background 128. The particle 105 is identified based on the detected shadow image 121. The size of the identified particle 105 is determined from the shadow image 121, as described in further detail below.

For an embodiment, a displacement distance of each of the individual shadow images 122 and 123 from the shadow image 121 indicates that shadows of particles outside the focal plane are displaced in the image plane at the camera and will not form deep shadows. The displacement distance in the image plane can be used to estimate the distance of the particles from the focal plane in the sample volume. This information can be used to determine if the particle is in sufficient focus to be sized accurately. For example, a displacement distance 131 between individual shadow images 122 and 123 is determined. For example, a displacement distance 129 between individual shadow image 122 and shadow image 121 on image plane 124 is determined. For example, a displacement distance 130 between individual shadow image 123 and shadow image 121 on image plane 124 is determined. For an embodiment, the focus of shadow image 121 is evaluated based on the distances 129 and 130 to determine a type of the particle.

For one embodiment, the type of the particle comprises a particle state—e.g., a liquid, a solid, a bubble in liquid or solid, or any combination thereof. For another embodiment, the type of the particle represents a particle shape, e.g., a spherical, oval, a multi-sided shape—e.g., triangular, rectangular, square, diamond, rhombus, other multi-sided shape,—or any other particle shape. For an embodiment, the particle information is determined based on the type of the particle. For one embodiment, the particle information comprises a particle velocity, a particle size, or any other particle information. For an embodiment, the size of the particle is at least 0.5 microns ("µm"). For another embodiment, the size of the particle is less than 5 microns ("µm"). For yet another embodiment, the size of the particle is in an approximate range from about 5 µm to about 3000 µm. For an embodiment, the plurality of illuminating light beams are synchronized with a digital camera, as described in further detail below.

Figure 2:
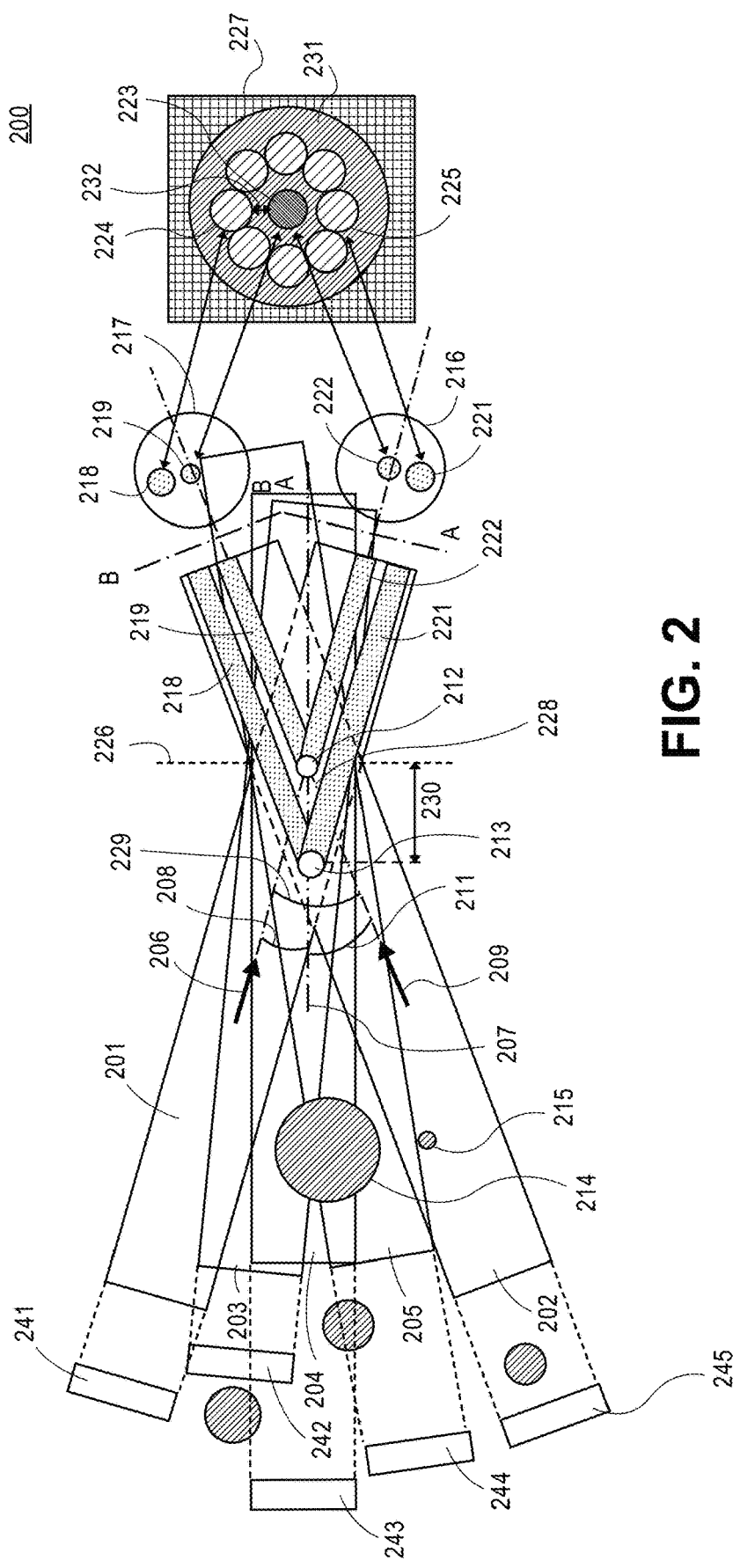
FIG. 2 shows a schematic of an apparatus to image particles using VCSELs with multiple beam illumination according to another embodiment.

FIG. 2 shows a schematic of an apparatus 200 to image particles using VCSELs according to another embodiment. Apparatus 200 comprises a plurality of VCSEL sources—e.g., a VCSEL source 241, a VCSEL source 242, a VCSEL source 243, a VCSEL source 244, a VCSEL source 245 to generate a plurality of illuminating light beams—e.g., illuminating light beams 201, 202, 203, 204, and 205—that converge with each other to form a measurement volume 228 within a particle field to provide uniformity in illumination of a background 231 on an image plane 227 of an imaging system that is associated with measurement volume 228 and to remove out of focus shadows in image plane 227. As shown in FIG. 2, VCSEL source 241 is configured to generate illuminating light beam 201, VCSEL source 242 is configured to generate illuminating light beam 202, VCSEL source 243 is configured to generate illuminating light beam 203, VCSEL source 244 is configured to generate illuminating light beam 204 and VCSEL source 245 is configured to generate illuminating light beam 205. For one embodiment, each of the VCSEL sources 242, 242, 243, 244, and 245 includes an array of VCSELs. As shown in FIG. 2, the illumination light intensity produced by the converging light beams of the VCSEL sources at every location of the background 231 is similar, so that the light intensity distribution across the entire background 231 is uniform. For one embodiment, the illumination of the background 231 is substantially free of speckles and diffraction patterns, as described in further detail below. An imaging optics is coupled to at least one of the plurality of vertical cavity surface emitting lasers, as described in further detail below. A digital camera is coupled to the imaging optics to obtain a shadow image of a particle passing through the measurement volume 228 at a focal plane 226 of the digital camera, as described in further detail below. A processor is coupled to the digital camera, as described in further detail below.

For one embodiment, each of the plurality of converging light beams 201, 202, 203, 204, and 205 is generated by at least one VCSEL. For one embodiment, at least some of the VCSELs generating the plurality of converging light beams 201, 202, 203, 204, and 205 are a part of a vertical cavity surface emitting laser array, as described in further detail below. For one embodiment, an array of VCSELs is configured to generate at least one of the plurality of converging light beams 201, 202, 203, 204, and 205. For one embodiment, the array of VCSELs that is configured to generate at least one of the plurality of converging light beams 201, 202, 203, 204, and 205 includes at least six VCSELs. For one embodiment, at least one of the light beams 201, 202, 203, 204, and 205 is generated by the array of VCSELs that are arranged in a circular pattern, as described in further detail below.

As shown in FIG. 2, each of the illuminating light beams 201, 202, 203, 204, and 205 propagates on a respective optical path along a respective direction through the particle field comprising particles, such as particles 212 and 213. For example, illuminating light beam 201 propagates on an optical path along a direction 206 and illuminating light beam 202 propagates on an optical path along a direction 209. For an embodiment the optical paths of the illuminating light beams 201, 202, 203, 204, and 205 are different. For an embodiment, the wavelengths of the illuminating light beams 201, 202, 203, 204, and 205 are similar. For one embodiment, the wavelength of the illuminating light beams 201, 202, 203, 204, and 205 is about 840 nm. For an embodiment, at least one of the illuminating light beams 201, 202, 203, 204, and 205 is a pulsed beam. For one embodiment, at least one of the pulsed illuminating light beams 201, 202, 203, 204, and 205 generated by the VCSELs for multi-beam imaging of particles has a fast rise time on the order of 200 picoseconds (ps), as described in further detail below. For one embodiment, the beams are pulsed in unison to "freeze" the particle motion, as described in further detail below. For one embodiment, particles 212 and 213 represent particles 104 and 105.

As shown in FIG. 2, illuminating light beams 201, 202, 203, 204, and 205 converge to form measurement volume 228 at focal plane 226 of an imaging system. Measurement volume 228 is a region where all illuminating light beams 201, 202, 203, 204, and 205 overlap, as shown in FIG. 2. The illuminating light beams 201, 202, 203, 204, and 205 intersect with each other at multiple angles. Each of the illuminating light beams 201, 202, 203, 204, and 205 is at a respective angle to an optical axis 207. As shown in FIG. 2, the beam 201 is at an angle 208 to an optical axis 207. The beam 202 is at an angle 211 to optical axis 207. For an embodiment, if one of the illuminating light beams 201, 202, 203, 204, and 205 is at a 0 degree angle to optical axis 207, other ones of the illuminating light beams 201, 202, 203, 204, and 205 can be at any angle other than 0 degree to optical axis 207 that allow the beams to enter the optic used for producing the image on the digital camera detector array.

As shown in FIG. 2, illuminating light beams 201 and 202 intersect at an angle 229. For an embodiment, angle 229 is a sum of angles 208 and 211. Particle 212 passing a portion of the measurement volume 228 at focal plane 226 produces a plurality of individual shadows from each of the illuminating light beams 201, 202, 203, 204, and 205, such as an individual shadow 219 from beam 202 and an individual shadow 222 from beam 201. Particle 213 passing a portion of the measurement volume 228 at a distance 230 away from focal plane 226 produces a plurality of individual shadows from each of the illuminating light beams 201, 202, 203, 204 and 205, such as an individual shadow 218 from beam 202 and an individual shadow 221 from beam 201. A cross-sectional view 216 of a measurement volume 228 along an axis A-A' perpendicular to direction 206 comprises individual shadows 221 and 222. A cross-sectional view 217 of a measurement volume 228 along an axis B-B' perpendicular to direction 209 comprises individual shadows 219 and 218, as shown in FIG. 2. A shadow image 223 of particle 212 is formed on an image plane 227 of an imaging system. Shadow image 223 is formed as a superposition of individual shadows—e.g., such as 219 and 222—from each of the illuminating light beams 201, 202, 203, 204, and 205.

As shown in FIG. 2, shadow image 223 is substantially different from a background 231 produced by the illuminating light beams 201, 202, 203, 204, and 205. Individual shadow images are formed from individual shadows on image plane 227, such as individual shadow images 224 and 225. For example, individual shadow image 224 is formed from individual shadow 218 and individual shadow image 225 is formed from individual shadow 216. Each of the individual shadow images is positioned at a distance 232 from shadow image 223 on image plane 227. The individual shadow images of particle 213 do not overlap and are separated from each other by a distance on image plane 227. For one embodiment, a contrast between the shadow image 223 and the background 227 is greater than a contrast between each of the individual shadow images 224 and 225 and the background 231. The illumination intensities of the individual shadow images 224 and 225 are substantially the same as that of background 231.

For one embodiment, the illumination intensity of the background 231 is monitored, and an intensity of at least one of the plurality of VCSELs is adjusted based on the monitored background illumination to obtain the shadow image 223. For one embodiment, a contrast between the shadow image 223 and the background 231 is measured. For one embodiment, it is determined if the measured contrast is greater than a predetermined contrast. If the measured contrast is greater than the predetermined contrast, the shadow image 231 is detected from the background 231. If the contrast is not greater than the predetermined contrast, the shadow image 231 is not detected from the background 231. The particle 212 is identified based on the detected shadow image 223. The size of the identified particle 212 is determined from the shadow image 223, as described in further detail below.

For an embodiment, the illuminating light beams are synchronized with the digital camera, as described in further detail below. For an embodiment, one or more intersection angles of the illuminating light beams are adjusted to set the measurement volume 228 at the focal plane 226 of the imaging system and to remove the shadow images of the particles outside the measurement volume 228. For an embodiment, a quantity of the illuminating light beams is adjusted to remove the shadow images of the particles outside the measurement volume 228.

Figure 3A:
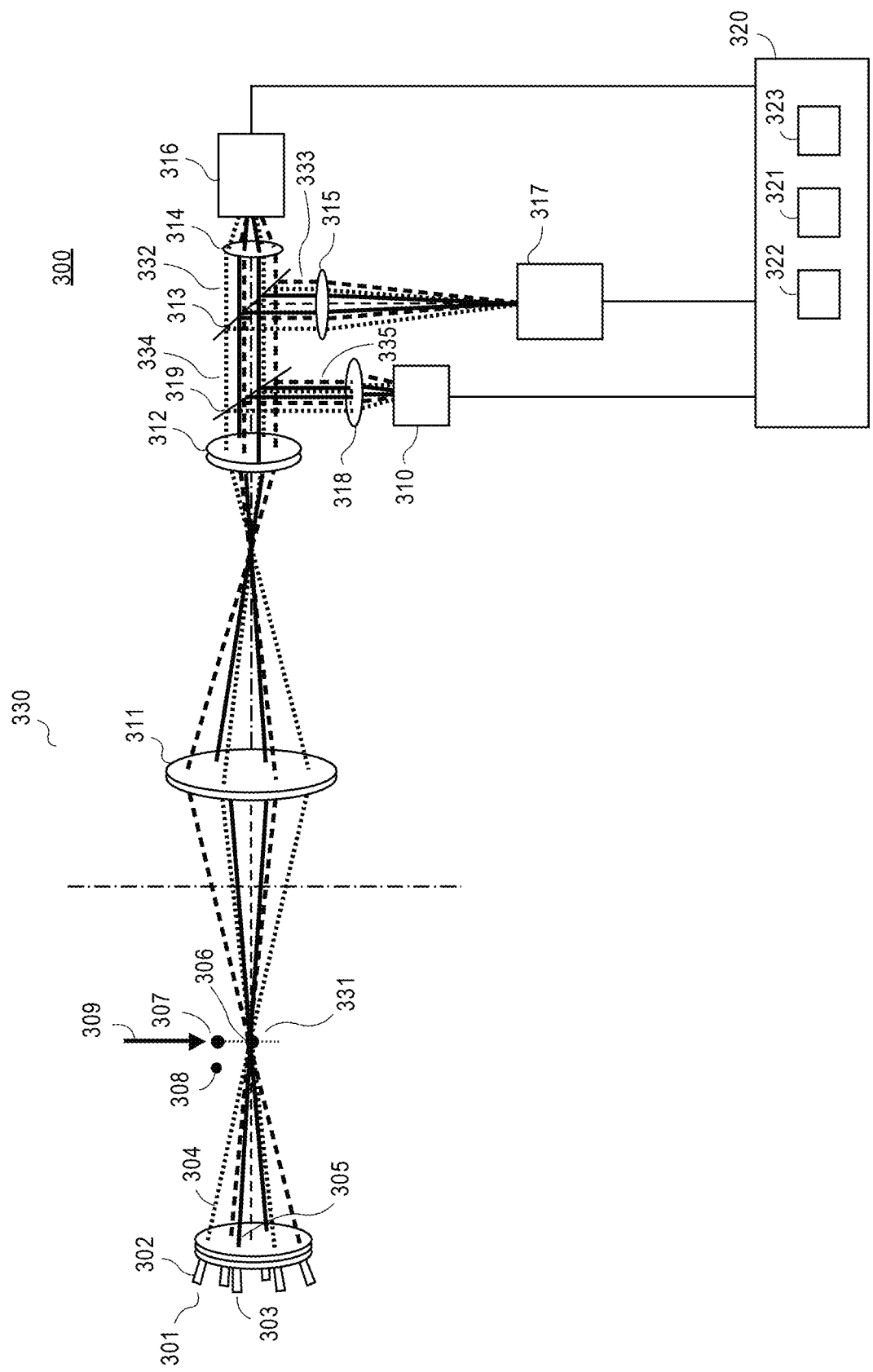
FIG. 3A is a view showing one embodiment of a system to provide multi-beam imaging using a plurality of VCSELs with two cameras to provide a wide range of size capability.

FIG. 3A is a view 300 showing one embodiment of a system 300 to provide multi-beam 435 imaging using a plurality of VCSELs. A system 300 comprises a transmitter system 301 and a receiver system 330. Transmitter system 301 includes one or more VCSEL sources—e.g., a VCSEL source 302 and a VCSEL source 303—generating a plurality of illuminating light beams—e.g., VCSEL source 302 is configured to generate an illuminating light beam 304 and VCSEL source 303 is configured to generate an illuminating light beam 305 propagating on multiple optical paths through a particle field comprising particles—e.g., particles 306, 307, and 308 moving along a direction 309. For one embodiment, each of the VCSEL sources includes an array of VCSELs. The illuminating light beams generated by the VCSEL sources converge to form a measurement volume at a focal plane 331 of an imaging system to provide uniformity in a background illumination on an image plane 124 of the imaging system and to remove out of focus shadows in the image plane, as described above. The illuminating light beams of FIG. 3A are represented by the illuminating light beams of FIGS. 1 and 2.

For an embodiment, transmitter system 301 comprises a light source coupled to the one or more VCSEL sources to generate a triggering light beam (not shown). For an embodiment, the triggering light beam is sent to generate a plurality of illuminating light beams, if the particle is detected in the measurement volume, as described in U.S. patent application Ser. No. 15/552,263.

Figure 3B:
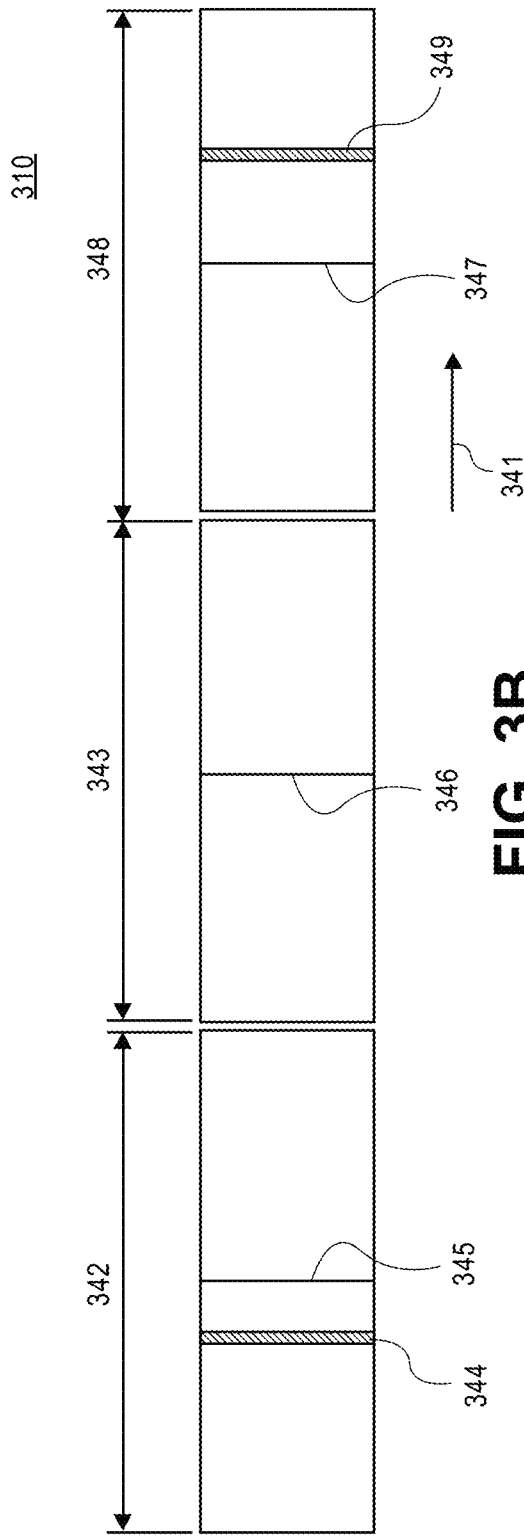
FIG. 3B is a view of a timing diagram illustrating synchronous sampling for multi-beam HSI imaging in a camera mode according to one embodiment.

FIG. 3B is a view 310 of a timing diagram illustrating synchronous sampling for multi-beam HSI imaging in a camera mode according to one embodiment. Often, particles (droplets, ice crystals, solid particles, or the like) are at a low concentration and moving at a high speed. For example, icing studies involve measuring particles moving at speeds of around 200 meters per second (m/s) in dilute particle fields. The camera shutter is opened at predetermined times to provide camera ready events (frames), such as a frame 342, a frame 343 and a frame 348 along a timeline 341. For one embodiment, the duration of each of the frames 342, 343 and 348 is determined based on the image acquisition rate of the camera. For one embodiment, the camera acquires images at 300 frames per second (Hz). In this case, the duration of each of the frames 342 and 343 is approximately 3 milliseconds (ms). In the camera mode, as the illuminating VCSEL laser source fires at fixed times synchronously with the camera shutter independent of whether the particles are present at the measurement volume, the probability of catching the particle may be very low, as described in further detail below.

As shown in FIG. 3B, the illuminating laser source generates laser pulses 345, 346 and 347 at fixed times. For one embodiment, the duration of each of the illuminating laser pulses 345, 346 and 347 is in an approximate range from about 20 nanoseconds (ns) to about 25 ns. Generally, a transit time of the particle passing through the image field is determined by the image width divided by the particle speed. For example, for the particle speed of about 200 m/s and the image width of about 2 mm, the particle transit time is in an approximate range of about 10 microseconds (µs). Typically, the particles arrive at the measuring volume at random intervals (e.g., described by Poisson statistics). In the camera mode, the laser fires at fixed times within the frames 342, 343 and 348 of the camera shutter independent of the particle. As shown in FIG. 3B, a particle residence time 344 does not overlap with the laser pulse 345 in the frame 342 and a particle residence time 349 does not overlap with the laser pulse 347. For dilute particle fields many frames, such as frame 343 are empty. This means that the chance of the particle being captured in the image frame when the lasers fire is very low. For one embodiment, the chance to catch the particle is about 0.67%.

Particles are recorded only if the laser fires when a particle is within the probe volume at the time of firing. For a particle arriving in the probe volume (area×depth of focus (DoF)), the probability of capture depends on overlapping of the particle transient (residence) time and the illuminating laser pulse. For one embodiment, probability of being in the camera time window (residence time divided by the camera open time) and the probability of the particle residence overlapping the laser firing is $P_1 = 10 \times 10^{-6}/3 \times 10^{-3} \sim 3 \times 10^{-3}$ that is very low. The dead time between camera ready events is deemed insignificant.

Figure 3C:
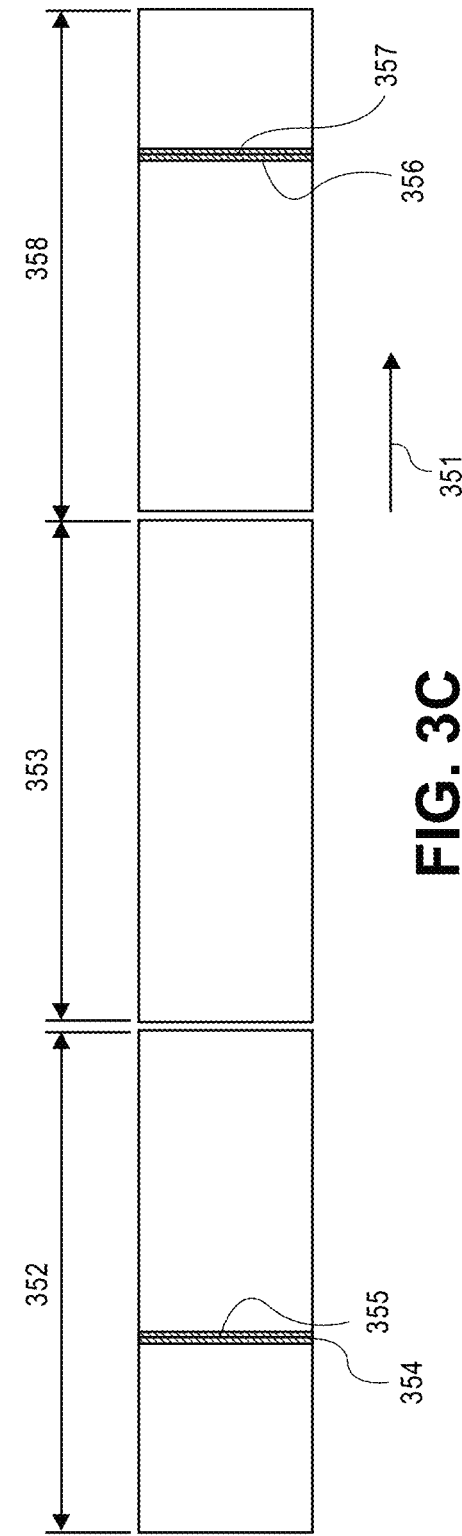
FIG. 3C is a view of a timing diagram illustrating sampling for multi-beam HSI imaging in a trigger mode according to one embodiment.

FIG. 3C is a view 320 of a timing diagram illustrating sampling for multi-beam HSI imaging in a trigger mode according to one embodiment. As shown in FIG. 3C, the camera shutter is opened at predetermined times to provide camera ready events (frames), such as a frame 352, a frame 353, and a frame 358 along a timeline 351. For one embodiment, the duration of each of the frames 352, 353 and 358 is approximately 3 milliseconds (ms). In the trigger mode, a trigger signal indicating detection of the particle in the measuring volume is generated using a trigger laser source, and the illuminating VCSEL laser source fires in response to the trigger signal. For one embodiment, the trigger signal is generated using a green CW laser, or any other laser source and the scattered light is collected by a receiver lens located at a suitable angle to the trigger beam. An aperture is used to limit detection of scattered light from only the region of the imaging system focal volume. Using the trigger approach, the illuminating VCSEL laser sources are fired only when the particle is detected within the observation region of the camera, so that the particle residence time overlaps with the illuminating laser pulse. As shown in FIG. 3C, the illuminating VCSEL source generates laser pulse 355 in response to the trigger signal that is generated when the particle is detected within the measuring volume during frame 352, so that a particle residence time 354 overlaps with the laser pulse 355. As shown in FIG. 3C, the illuminating VCSEL source generates laser pulse 357 in response to the trigger signal that is generated when the particle is detected within the measuring volume during frame 358, so that a particle residence time 356 overlaps with the laser pulse 357. As shown in FIG. 3C, the illuminating VCSEL source does not generate the laser pulse if the particle is not detected within the measuring volume during frame 353. That is, the detection of the particle is coincident with the time when the particle is in the view volume of the camera. This serves to significantly improve the rate at which particles are imaged. For one embodiment, in the trigger mode an increase of the sampling rate is in an approximate range from about 150 times to about 300 times comparing to the camera mode.

Referring back to FIG. 3A, receiver system 330 comprises an imaging optics coupled to at least one of the plurality of VCSEL sources and one or more digital cameras coupled to the imaging optics to provide a shadow image of a particle 306 passing through the measurement volume at focal plane 331, as described above. For one embodiment, multiple digital cameras—e.g., digital cameras 316, 317 and 310—are used to adjust a dynamic range for the particles. For one embodiment, the size dynamic range of the particles is about 500:1.

As shown in FIG. 3A, the imaging optics of the receiver system 330 comprises one or more receiver lenses 311 to receive the individual shadows of the particle 306 from each of the illuminating light beams, as described above. One or more image transfer lenses 312 transfer individual shadow images of the particle 306 to a beam splitter 313. Beam splitter 313 splits the illuminating light beams comprising the individual shadow images of the particle 306 into a portion 332 and a portion 333. Portion 332 is sent to one or more focusing lenses 314 to form a shadow image of the particle 306 on an image plane of a digital camera 316. Portion 333 is sent to one or more focusing lenses 315 to form a shadow image of the particle 306 on an image plane of a digital camera 317. The imaging system can optionally comprise a beam splitter 319 to split the illuminating light beams comprising the individual shadow images of the particle 306 into a portion 334 and a portion 335. In this case, portion 334 is sent to beam splitter 313 to form a shadow image of the particle 306 on corresponding image planes of digital cameras 316 and 317. Portion 335 is sent to one or more focusing lenses 318 to form a shadow image of the particle 306 on an image plane of a digital camera 310. For one embodiment, the multiple camera approach is used to allow different magnifications to enable sizing particles with high resolution over a wide size range.

A processing system 320 is coupled to the receiver system 330. Processing system 320 comprises a processor 321, a memory 322, and a display 323 to display shadow images of the particles passing through the measurement volume. For one embodiment, the processor 321 is coupled to one or more digital cameras to monitor the background illumination and to adjust an intensity of at least one of the plurality of VCSELs based on the monitored background illumination to obtain the shadow image of the particle.

For one embodiment, the processor 321 is coupled to one or more digital cameras to measure a contrast between the shadow image and the background and to determine if the measured contrast is greater than a predetermined contrast. If the measured contrast is greater than the predetermined contrast, the processor 321 is configured to detect the shadow image from the background. If the contrast is not greater than the predetermined contrast, the processor 321 is configured to not detect the shadow image from the background. The processor 321 is configured to identify the particle based on the detected shadow image. The processor 321 is configured to determine the size of the identified particle from the shadow image, as described in further detail below.

For another embodiment, the processor 321 is configured to detect the shadow image, to evaluate a depth of field of the particle, a focus of the particle, or both based on the shadow image to determine a type of the particle based on the evaluation, and to determine particle information based on the type of the particle, as described in further detail below.

For one embodiment, the size range of the imaging system is extended to cover a dynamic size range of from 3 μm to 3000 μm. This can be accomplished with high resolution and very efficient image capture and transfer to the image processing computer using different magnifications and separate CMOS cameras.

As described in FIGS. 1, 2 and 3, the multi-beam illumination system includes multiple light sources that are aligned to converge to a common measurement (probe) volume. For one embodiment, the multiple light sources are pulsed simultaneously to pulse durations below 25 nanoseconds (ns), therefore freezing the motion of the particles, even at the small scales resolved by the microscope imaging system. This approach provides an intense relatively uniform illumination in the sample volume, while minimizing laser speckle and diffraction, by merging the phases of the different laser wave fronts. Producing a more homogeneous background is critical in achieving high resolution and high quality images. An advantage of the multi-beam illumination comes from the different optical paths that the converging laser beams traverse to the measurement volume. If a large particle crosses one beam outside of the sample volume, the shadow produced by this particle does not significantly affect the background illumination because the other beams are not coincidently affected by this particle. Only particles that pass within the depth-of-field of the imaging system at the probe volume which is coincident with where the beams cross and overlap form sharp deep shadows. Particles passing the probe volume outside the focal plane do not produce deep shadows because the shadow appears in only one beam at any instant and location. Thus, even for relatively dense sprays and under conditions with very large drops, the background noise due to out of focus images is minimized.

Figure 4:
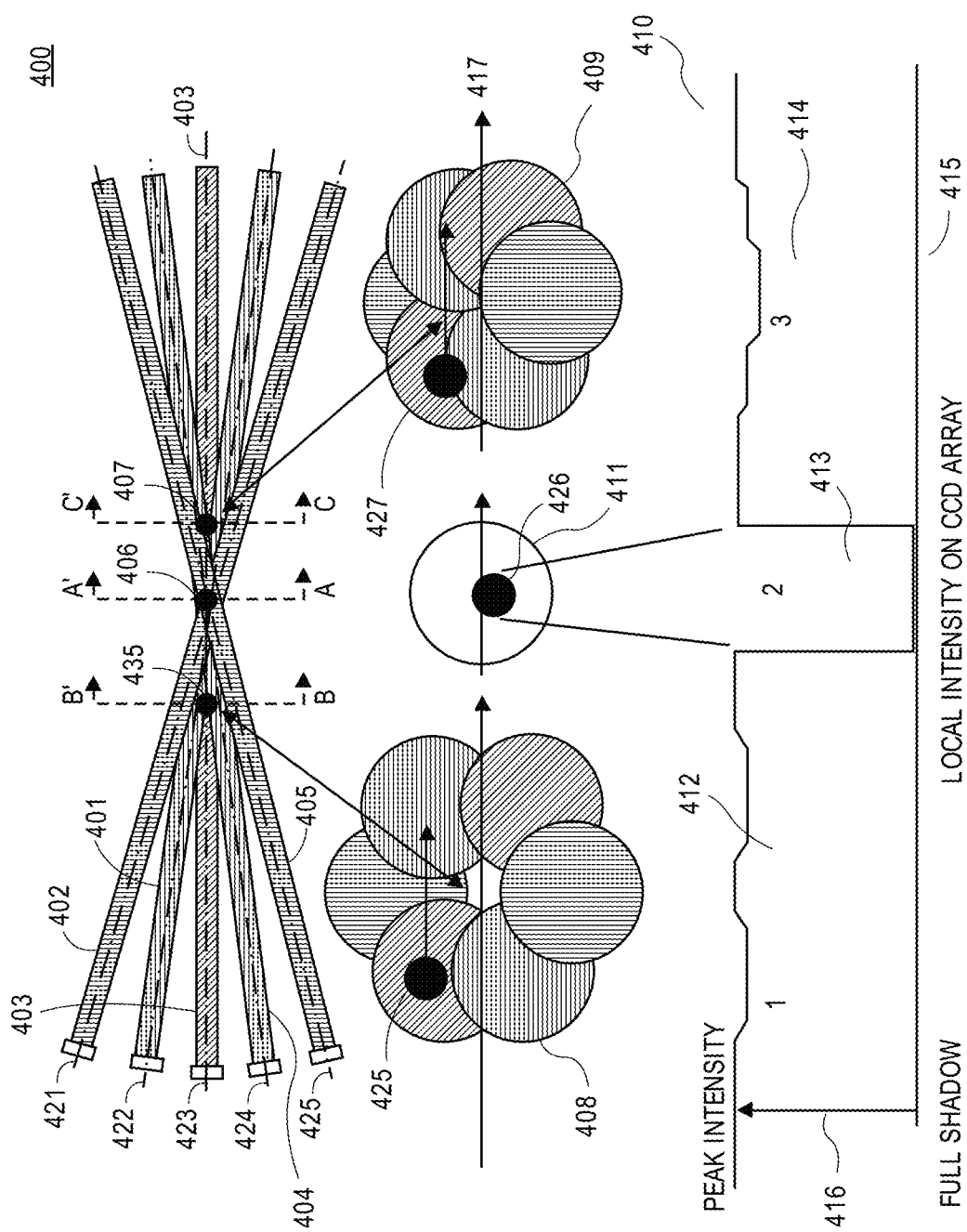
FIG. 4 is a view illustrating a multi-beam illumination system according to one embodiment.

FIG. 4 is a view 400 illustrating a multi-beam illumination system according to one embodiment. A plurality of VCSEL sources—e.g., a VCSEL source 421, a VCSEL source 422, a VCSEL source 423, a VCSEL source 424, a VCSEL source 425, —generate a plurality of illuminating light beams— e.g., illuminating light beams 401, 402 403, 404, and 405— propagate on respective optical paths along respective directions through a particle field comprising particles, such as particles 435, 406, and 407. VCSEL, sources 421, 422, 423, 424 and 425 represent VCSEL sources described above with respect to FIGS. 1-3. Particles 435, 406 and 407 represent particles described above with respect to FIGS. 1-3. The illuminating light beams 401, 402 403, 404, and 405 represent the illuminating light beams described with respect to FIGS. 1-3. The illuminating light beams converge to form a measurement volume at a focal plane of an imaging system. The focal plane of the imaging system propagates along an axis A-A', The measurement volume is a region where all of the illuminating light beams overlap, as shown in FIG. 4.

Particle 406 passing a portion of the measurement volume at the focal plane of the imaging system produces a plurality of individual shadows from each of the illuminating light beams that overlap to form a shadow image 426 of the particle 406 on the image plane of the imaging system. A cross-sectional view 411 of the measurement volume along the axis A-A' perpendicular to an optical axis 417 comprises the shadow image 426. Particle 435 passing illuminating light beam 403 before the focal plane A-A' produces an individual shadow 425 from the illuminating light beam 403. Particle 435 does not produce shadows from other illuminating light beams, such as illuminating light beams 401 and 402. A cross-sectional view 408 of the illuminating light beams along an axis B-B' perpendicular to optical axis 417 comprises individual shadow 425 caused by beam 403. Particle 407 passing illuminating light beams 403 and 428 after the focal plane A-A' produces an individual shadow 427 from the illuminating light beams 403 and 428. Particle 407 does not produce individual shadows from other illuminating light beams, such as illuminating light beams 401 and 402. A cross-sectional view 409 of the illuminating light beams along an axis C-C' perpendicular to optical axis 417 comprises shadow 427 that is a superposition of the individual shadows caused by beams 403 and 428.

A graph 410 illustrates one embodiment of light intensity 416 versus a distance on a CCD array 415. The light intensity 416 varies from peak intensity to a full shadow, as shown in graph 410. The peak intensity corresponds to a background condition when there is no particle that crosses at least one of the beams. As shown in graph 410, light intensity of the shadow image 426 of the particle 406 in a region 413 of the CCD array is substantially lower than the light intensity in a region 412 and a region 414 of the CCD array. That is, the shadow image of particle 406 is substantially different from the background peak light intensity and from the light intensity of the individual shadow images 425 and 427.

As shown in FIG. 4B, the illuminating light beams converge at the measurement volume to emulate white light illumination. For one embodiment, color CCDs (RGB) are used to extract color information on the shadow image. Color information can provide additional dimensional information on the particle shadows. Delays between various color illuminations can also be used to measure velocity (analogous to double pulsing a single laser). For one embodiment, double pulse imaging is implemented to provide shadow particle tracking velocimetry (PTV) images to obtain droplet and spray structure size and velocity. The duration of the one or more illumination pulses is naturally limited by the resolution of the imaging system and the speed of the target particle. For one embodiment, for a microscopic imaging, maximum pulse duration of about 20 ns is used (2 μm blur at 100 m/s). For example, if the particle is moving at 100 m/s, it will move 2 μm in 20 ns. This will blur the edges by 2 microns. For smaller particles, shorter pulse duration is used to minimize blur. For one embodiment, parameters of the illuminating light beams, such as an intersection angle, a number of beams, and wavelengths are optimized to prevent the individual shadow images of the particles outside the focal plane from being formed.

Figure 5A:
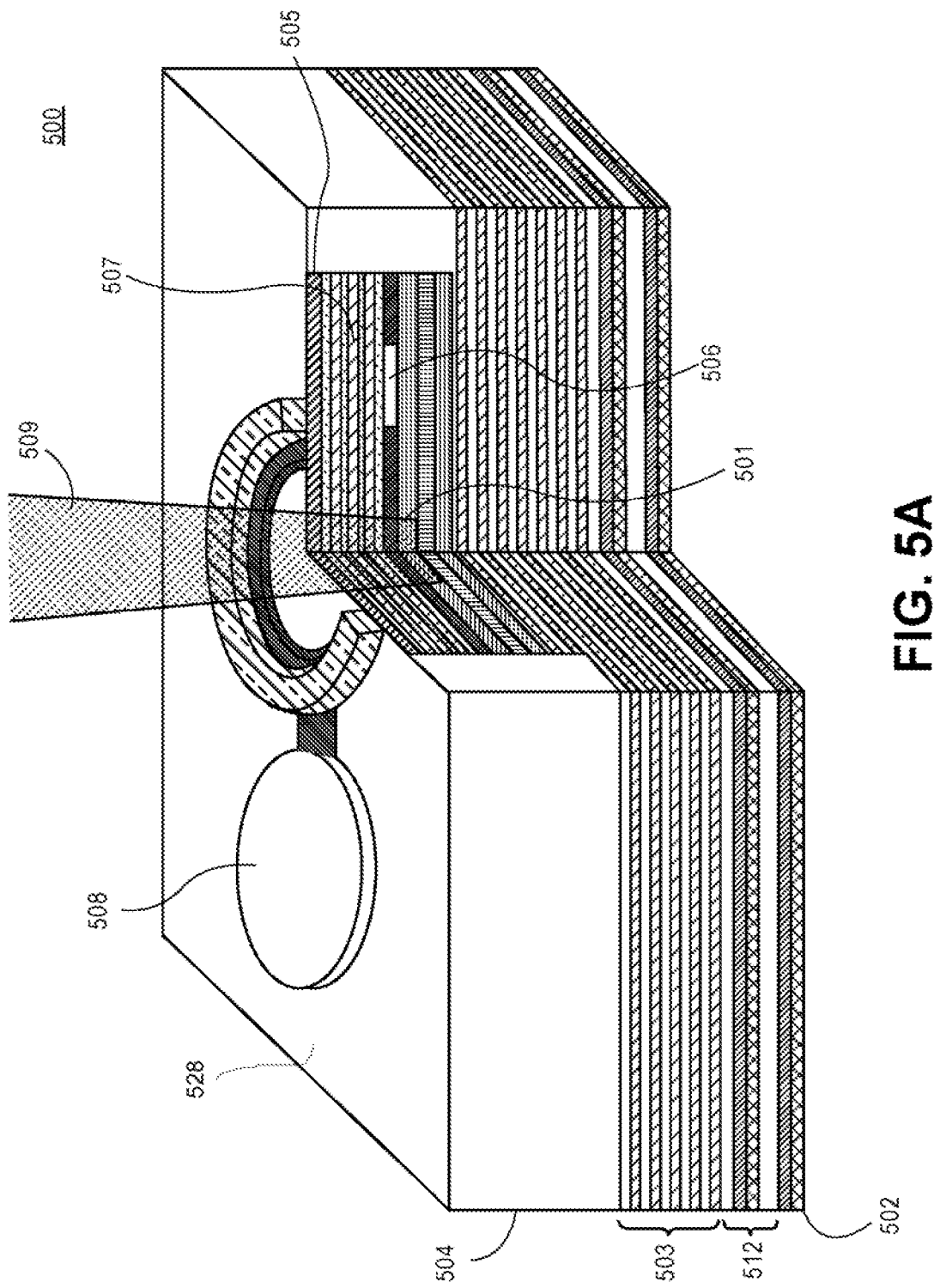
FIG. 5A is a view illustrating a schematic layout of a vertical cavity surface emitting laser (VCSEL) source of a multi-beam particle imaging system according to one embodiment.

FIG. 5A is a view illustrating a schematic layout of a vertical cavity surface emitting laser (VCSEL) 500 that is a part of the VCSEL source of a multi-beam particle imaging system according to one embodiment. Generally, a VCSEL includes a plurality of semiconductor layers that are grown on top of each other on a substrate, as known to one of ordinary skill in the art of VCSEL device manufacturing. As shown in FIG. 5A, the VCSEL includes an active quantum well (QW) layer 501 on a diffraction Bragg grating (DBR) layer 503 on a substrate 512 on a metal contact layer 502. A DBR layer 507 is deposited on an oxide aperture layer 506 on active QW layer 501. A metal contact layer 505 is deposited on DBR layer 507. An insulating layer 528 is deposited on portions of DBR layer 503, DBR layer 507 and metal contact layer 507. A metal pad 508 is deposited on insulating layer 528 to connect to metal contact layer 505. Generally, in the lasing medium of the VCSEL, the tight solitaries perpendicular to the layers and escapes through the top (or bottom) of the device. As shown in Figure SA, a light 509 oscillates perpendicular to the layers 501, 503, 505, 506 and 507 and outputs through the top of the device structure. This results in a nearly top hat circular beam profile 511, as shown in FIG. 5B, For one embodiment, VCSEL 500 represents one of the VCSELs of the VCSEL sources described above.

Figure 5B:
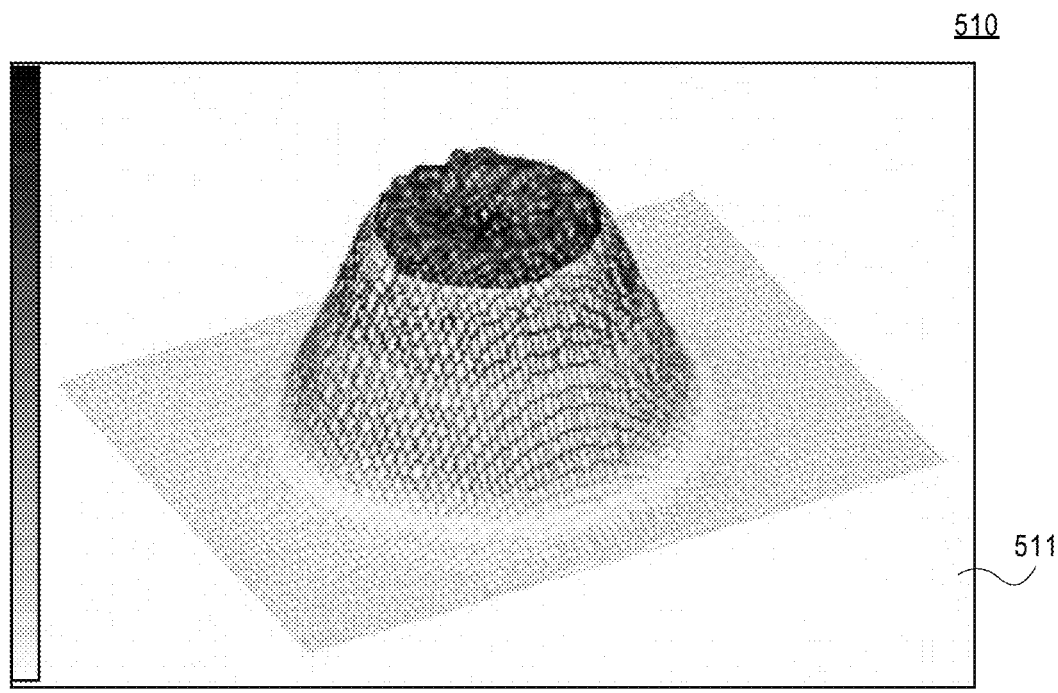
FIG. 5B is a view showing an example of the light beam profile generated by the VCSEL source according to one embodiment.

FIG. 5B is a view 510 showing an example of the light beam profile 511 generated by the VCSEL source according to one embodiment. As shown in FIG. 5B, the light beam profile 511 is a substantially circularly symmetric beam profile. For one embodiment, the beam divergence angle of the VCSEL source is approximately 20 degrees ($1/e^2$). For one embodiment, the light beam produced by the VCSEL source is collimated for transmission over the distances larger than the transmission distances of the LEDs. The beam profile 511 is a quasi-top hat profile which is close to ideal for particle imaging applications.

Figure 5C:
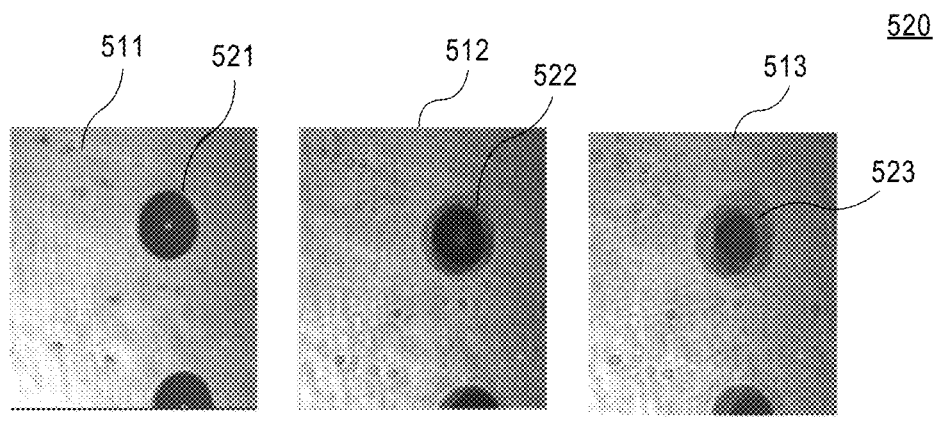
FIG. 5C is a view showing examples of multi-beam illumination images of particles that pass the measurement volume at different distances from the focal plane of the imaging system.

FIG. 5C is a view 520 showing examples of multi-beam illumination images of particles that pass the measurement volume at different distances from the focal plane of the imaging system. As shown in FIG. 5C, the shadow images of the particle formed by the each of the illuminating beams move away from each other as the particle moves away from the focal plane of the imaging system. An image 511 shows shadow images of the particles passing the measurement volume at a focal plane of the imaging system. As shown in image 511, the individual shadow images of the particle formed by each of the illuminating beams fully overlap to form a shadow image 521 that is substantially separate from the background. An image 512 shows the shadow images of the particles passing the measurement volume at about 100 μm away from the focal plane of the imaging system. As shown in image 512, the individual shadow images of the particle from each of the illuminating beams overlap only partially (about 75%) resulting in a shadow image 522 that is more blurred and less separate from the background than image 521. An image 513 shows the shadow images of the particles passing the measurement volume at about 200 μm away from the focal plane of the imaging system. As shown in image 513, the shadow images of the particle from each of the illuminating beams overlap only about 50% resulting in a shadow image 522 that is more blurred and less separate from the background than image 522.

Capturing high-resolution images at large distances is challenging, but the difficulty increases when dense particle fields obscure the optical path between the light source, the probe volume and the collection optics. The multi-beam illumination approach relies on different optical paths from the light sources to overcome punctual shadowing by individual particles along the beam path.

Existing particle imaging systems suffer from lack of uniformity in the background illumination. The coherent and highly monochromatic laser sources used in the illumination system produce speckle and diffraction patterns. The speckle and diffraction patterns prevent the image processing algorithm from performing under optimal conditions, thus affecting the results.

Figure 6A:
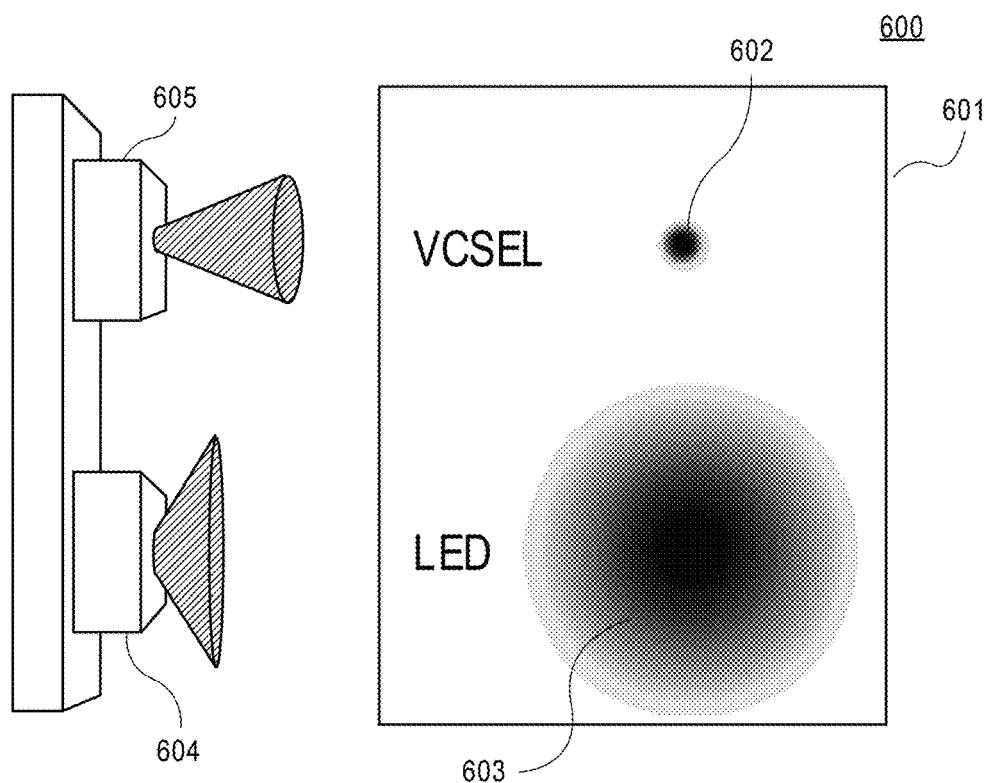
FIG. 6A is a view illustrating a two-dimensional illumination profile of a VCSEL array and a two-dimensional illumination profile of a LED system according to one embodiment.

FIG. 6A is a view 600 illustrating a two-dimensional illumination profile 602 of a VCSEL array 605 and a two-dimensional illumination profile 603 of a LED system 604 according to one embodiment. The beam divergence angle of the VCSEL arrays is approximately 20 degrees. For one embodiment, the VCSEL array for the multi-beam particle imaging includes a plurality of VCSELs coupled to an integrated optics that shapes the beam to narrow divergence distributions, so that the beam generated by the VCSEL array can be collimated for transmission over a distance that is larger than the transmission distance of the LEDs. For one embodiment, VCSEL array 605 represents one of the VCSEL arrays described above. As shown in FIG. 6A, the illumination distribution represented by the two-dimensional profile 602 has substantially narrow angle compared to that of two-dimensional illumination profile 603 that makes the VCSEL advantageous when it comes to collecting and remotely directing the light onto a scene for example. LEDs are typically equipped with a polymethylmethacrylate (PMMA) or glass dome, shaping the light from quasi-Lambertian from the die emitter to a wide somewhat Gaussian distribution. The VCSEL devices on the other hand present a light emission profile close to a top-hat shape, with a possible dip on the axis. Proper optical implementation of the VCSEL allows efficient light transmission. For one embodiment, the VCSEL arrays for the multi-beam imaging of particles are configured to have a very short coherence length that is similar to that of the LED system that minimizes laser speckle. For one embodiment, the VCSEL arrays for the multi-beam imaging of particles are configured to have speckle of less than 1% that makes the VCSELs ideal for imaging systems to provide the uniformity of the illumination. For one embodiment, the VCSEL sources the VCSEL arrays for the multi-beam imaging of particles are pulsed at high rates with short (12 to 25 nanosecond durations) and have very fast rise times, generally below a nanosecond, that make the VCSEL sources ideal for pulsed laser particle imaging applications. For one embodiment, the VCSEL array for the multi-beam imaging system produces at least 250 milliwatt (mW) output power. For one embodiment, the VCSEL array for the multi-beam imaging system produces 750 mW output power at the 860 nm wavelength, and includes about 200 lasers.

For one embodiment, the multi-beam system to image particles includes an electronic driver and an optical system that implements the VCSEL technology. The pulsed characteristics of VCSEL are known to be fast, as these devices are widely used for optical fiber communication. For one embodiment, the VCSEL arrays used for the multi-beam imaging of particles are configured to output the power to generate the flux necessary to illuminate the scene with enough intensity for the imaging system to properly respond. For one embodiment the electronic driver of the multi-beam imaging system is capable of producing short pulses of high current (up to 2 A), and voltage from OV to 40 V to drive the VCSEL array provide high-speed performance and short pulse characteristics of the illuminating light beams.

Figure 6B:
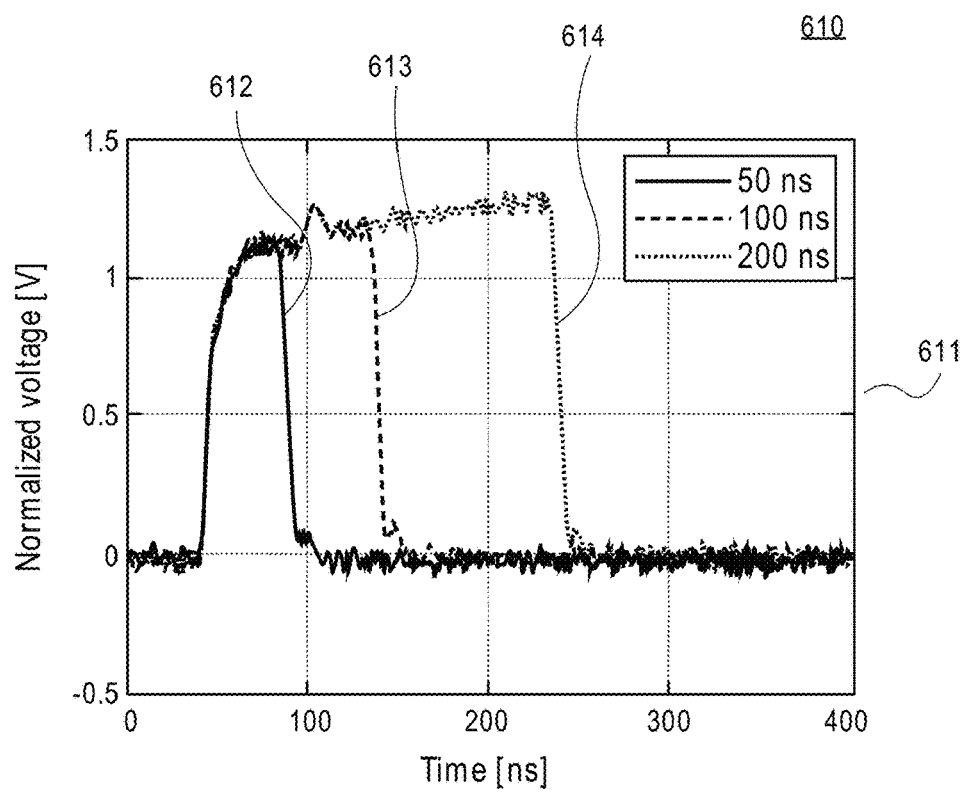
FIG. 6B is a view showing measured pulse profiles of the VCSEL source of the multi-beam imaging system according to one embodiment.

FIG. 6B is a view 610 showing measured pulse profiles of the VCSEL source of the multi-beam imaging system according to one embodiment. As shown in FIG. 6B, a measured pulse profile 612 of the VCSEL source is generated at driving pulse duration 50 ns, a measured pulse profile 613 of the VCSEL source is generated at driving pulse duration 100 ns and a measured pulse profile 614 of the VCSEL source is generated at driving pulse duration 200 ns.

For one embodiment, the ramps of the profiles overlap over the corresponding "active" period of the VCSEL. The slew rate of the VCSEL for the first 80% of the rise is very fast, and then slows down until a plateau. As shown in FIG. 6B, the pulse signal rises in level with pulse duration.

Figures 6C, 6D:
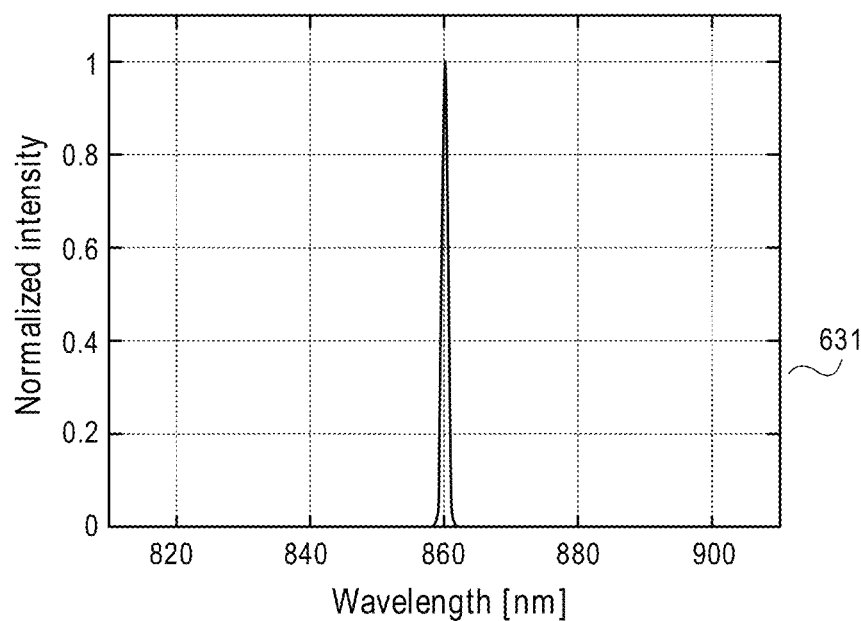
FIG. 6C is a view of a table illustrating characteristic properties of the VCSEL system regarding switching performance according to one embodiment.
FIG. 6D is a view showing a measured spectrum of the VCSEL array of the multi-beam imaging system according to one embodiment.

FIG. 6C is a view 620 of a table 621 illustrating characteristic properties of the VCSEL system regarding switching performance according to one embodiment. The table 621 shows that the measured pulse duration is closer to the set duration, with only 7 ns difference, across all durations tested from 15 to 200 ns. This reveals that the switching time of the VCSEL is short, on the order of nanoseconds.

FIG. 6D is a view 630 showing a measured spectrum 631 of the VCSEL array of the multi-beam imaging system according to one embodiment. As shown in FIG. 6D, the output wavelength of the VCSEL array is centered at 860 nm, a frequency doubling wavelength, or other wavelengths. For one embodiment, the wavelengths shorter than 860 nm are used to increase image resolution. For one embodiment, the VCSEL array outputs a beam that has a spectral spread close to 1 nm full-width at half-maximum. Typically, the wavelength of the illumination determines the diffraction-limited resolution. A longer wavelength may be detrimental to optical resolution in microscope systems. Narrow-divergence, nearly-collimated light generated by the VCSEL array presents an advantage over the LED illumination for remote illumination of an area with high energy density and for beam shaping.

Figure 7A:
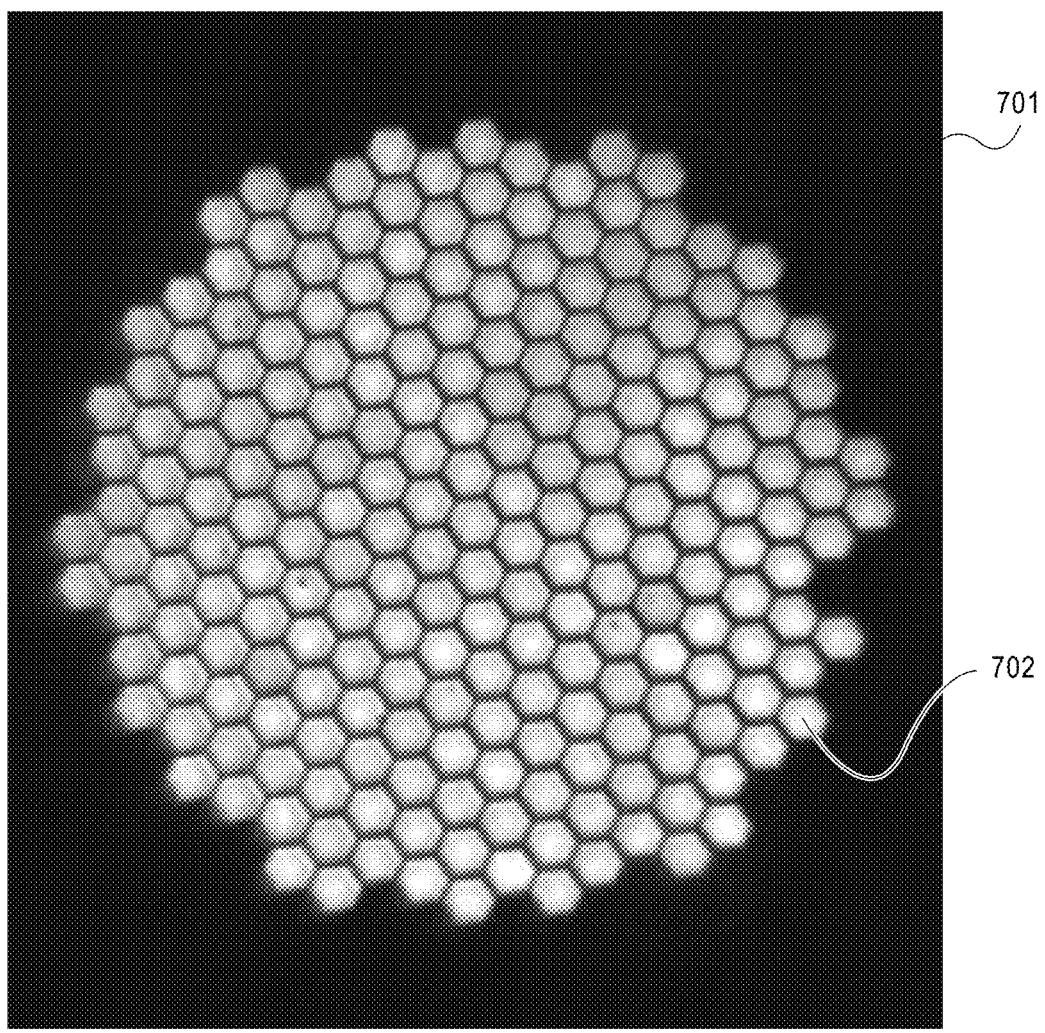
FIG. 7A is a photograph of the emitting area of the VCSEL array of the multi-beam imaging system according to one embodiment.

FIG. 7A is a photograph 700 of the emitting area of the VCSEL array 701 of the multi-beam imaging system according to one embodiment. The photograph 700 is acquired with a digital microscope. As shown in FIG. 7A, the emitting area of the VCSEL array 701 is approximately 3 mm in diameter. The VCSEL array 701 includes individual VCSELs, such as a VCSEL 702. For one embodiment, VCSEL 702 represents VCSEL 500. For one embodiment, VCSEL array 701 represents one of the VCSEL sources described above with respect to FIGS. 1-6. As shown in FIG. 7A, each VCSEL of the array has a hexagonal shape. As shown in FIG. 7A, the VCSELs of the array are arranged in a circular pattern to generate a single beam. For one embodiment, the VCSEL array is equipped with a lens, such that the beam divergence angle is reduced from a typical VCSEL beam divergence angle of 20 degrees to approximately 7 degrees to increase uniformity in the background illumination to obtain the shadow image of the particle.

For one embodiment, the multi-beam particle imaging system including one or more VCSEL arrays to generate multiple illuminating light beams improves image quality substantially by removing speckle from the background, and by reducing or eliminating diffraction patterns. For one embodiment, the multi-beam particle imaging system including one or more VCSEL arrays to generate multiple illuminating light beams is arranged in a line-of-sight configuration for bright field optical microscopic applications.

FIG. 7B is a view 710 showing a resolution chart 711 captured by a long distance microscope when a scene is illuminated by a LED source and a resolution chart 712 captured by the long distance microscope when the scene is illuminated by a VCSEL source according to one embodiment. Both LED and VCSEL illumination sources are pulsed, and the camera is synchronized with the light pulses.

As shown in FIG. 7B, the resolution chart 712 represents more uniform and speckle free light intensity distribution than the resolution chart 711. As shown in FIG. 7B, the resolution chart 712 has a near top-hat profile of the light intensity distribution comparing to resolution chart 711. As shown in FIG. 7B, the resolution chart 712 represents higher resolution than that of the resolution chart 711.

Figure 8:
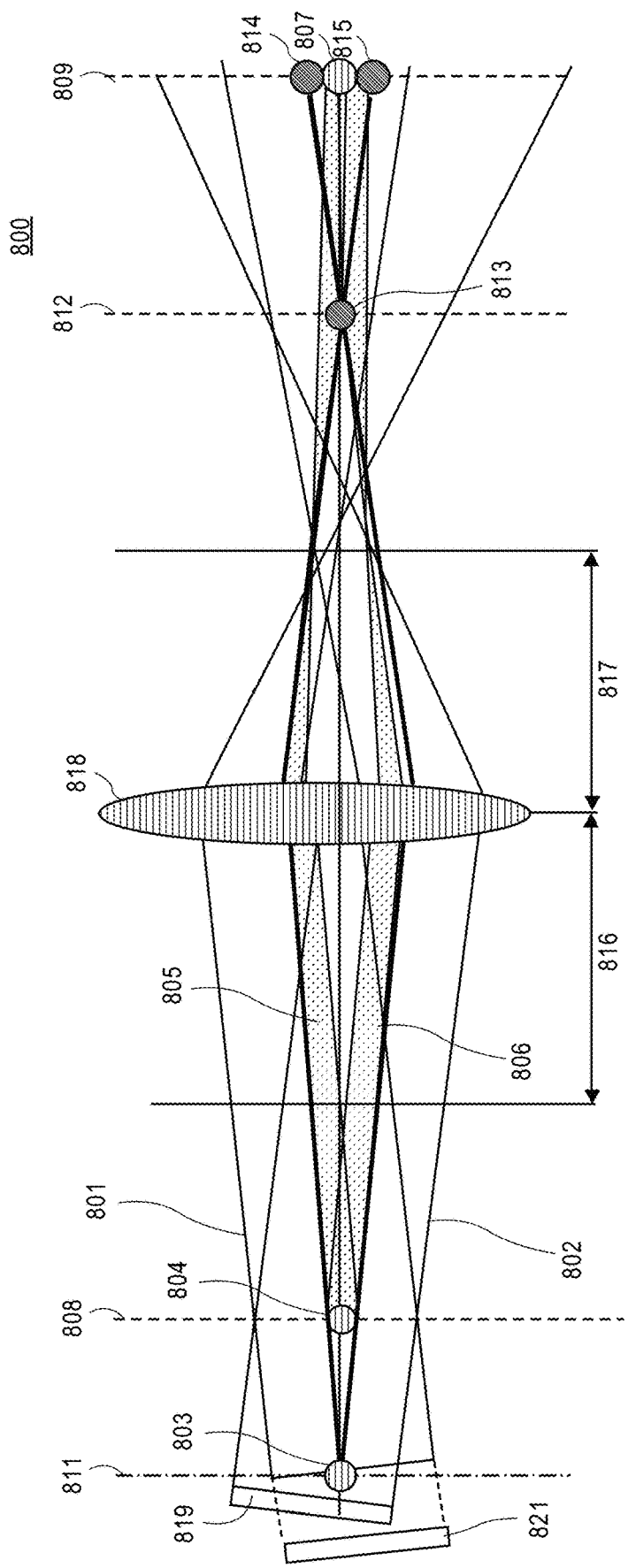
FIG. 8 is a schematic illustrating how shadows do not overlap for particles outside of the focal plane of the imaging optics according to one embodiment.

FIG. 8 is a schematic 800 illustrating how shadows do not overlap for particles outside of the focal plane of the imaging optics according to one embodiment. As shown in FIG. 8, the multi-beam imaging system includes a VCSEL source 819 and a VCSEL source 821. VCSEL source 819 generates an illuminating light beam 801 and VCSEL source 820 generates an illuminating light beam 802 that intersect with each other and propagate through a lens 818. Lens 818 has a focal distance 816 and a focal distance 817. For one embodiment, each of the VCSEL sources 819 and 821 represents one of the VCSEL sources described above. Particles 803 and 804 pass the measurement volume formed by overlapping illuminating light beams 801 and 802 at planes 811 and 808 respectively. Illuminating light beams forming the shadows of the particles—such as shadows 805 and 806—are admitted into the lens 818 and the digital camera—e.g., CMOS, CCD array, or other digital camera.

Initially, plane 808 is a focal plane of the lens 818. Particle 804 at the focal plane of the lens 818 produces a single focused shadow image 807 on an image plane 809. Particles away from the focal plane, such as particle 803 produce two out of focus shadow images at the image plane. After the camera is re-focused to plane 811, the individual shadows of particle 803 collapse onto a single shadow 813 at an image plane 812 whereas the shadow at image plane 809 will separate into an individual shadow 814 and an individual shadow 815.

The image depth of field and the circle of confusion are generally set by the requirements of the imaging system. The depth of field problem, however, is one of the most serious sources of measurement error when using imaging systems to measure particle size distributions. Generally, the depth of field refers to a range over which an optical instrument produces a sharp image of an object. Particles detected outside of the depth of field of the receiver optics cause a significant increase in the measurement error because the sizes of the unfocused particle images appear to be different from the true values.

The camera monitors the attenuation or shadow pattern produced by individual particles by detecting and identifying them from the bright background generated by the illumination. Proper and adequate illumination is an important parameter that needs to be adjusted carefully to obtain high quality imaging data. That is why it is paramount to be able to measure the background intensity on the CMOS camera and adjust the light intensity accordingly to capture high-quality particle images.

Figure 9A:
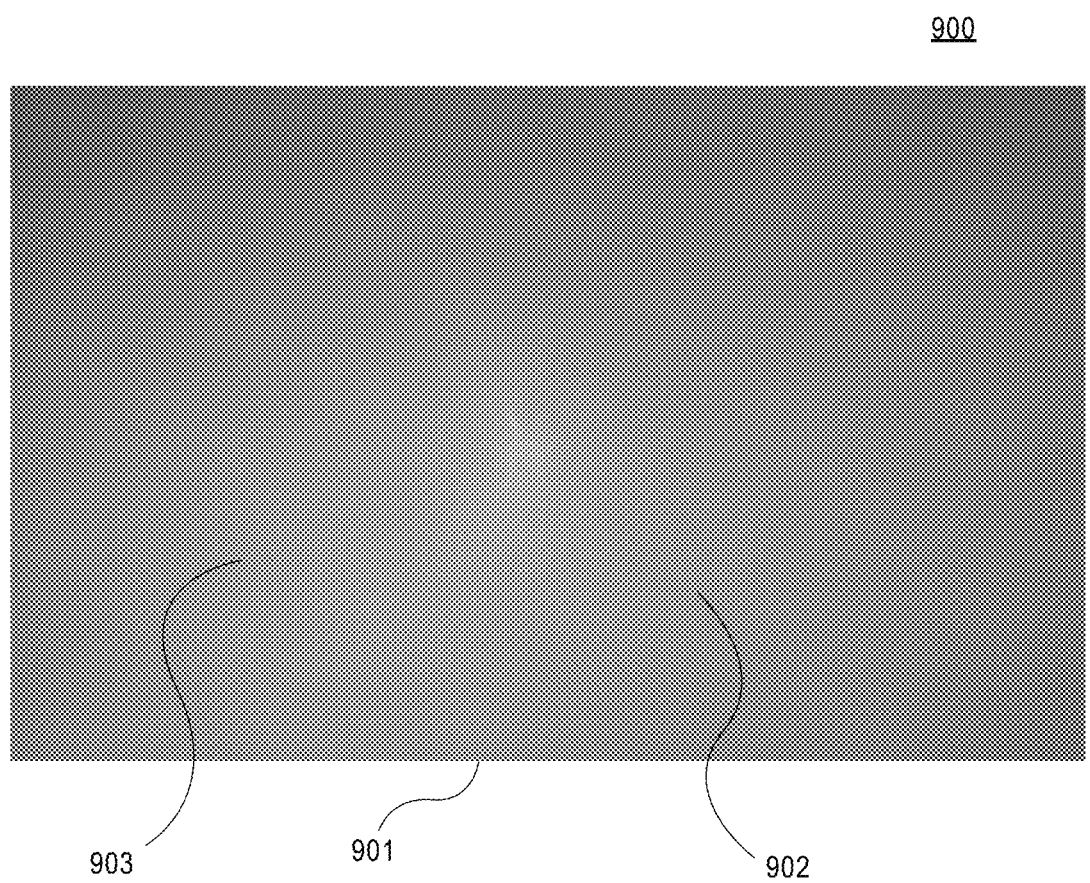
FIG. 9A is a view showing an image of a background 901 illuminated by converging beams generated by a VCSEL system of the multi-beam imaging apparatus according to one embodiment.

FIG. 9A is a view 900 showing an image of a background 901 illuminated by converging beams generated by a VCSEL system of the multi-beam imaging apparatus according to one embodiment. As shown in FIG. 9A, the illumination light intensity produced by the converging light beams of the VC SEL sources at different locations of the background 901—such as a location 903 and a location 902—is similar, so that the distribution of the light intensity across the entire background 901 is relatively uniform. The smooth and uniform background illumination contributes to the proper operation of the image processing algorithm, which relies on the intensity contrast between the background and particles to identify a feature and quantify the feature size.

Figure 9B:
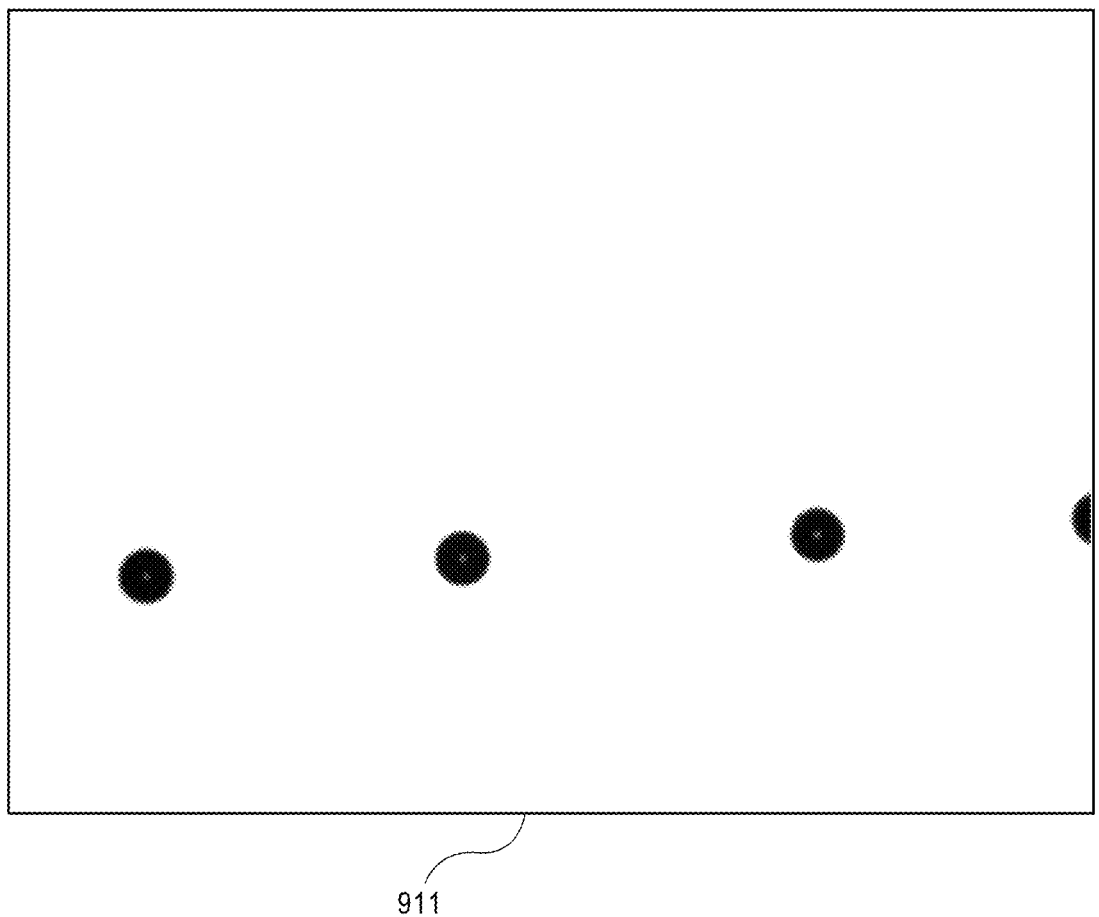
FIG. 9B is a view showing an image of monodisperse droplets generated using VCSEL illumination of the multi-beam imaging apparatus according to one embodiment.

FIG. 9B is a view 910 showing an image of monodisperse droplets 911 generated using VCSEL illumination of the multi-beam imaging apparatus according to one embodiment. As shown in FIG. 9B, the background lighting is uniform and shows no speckle or diffraction noise.

Figure 9C:
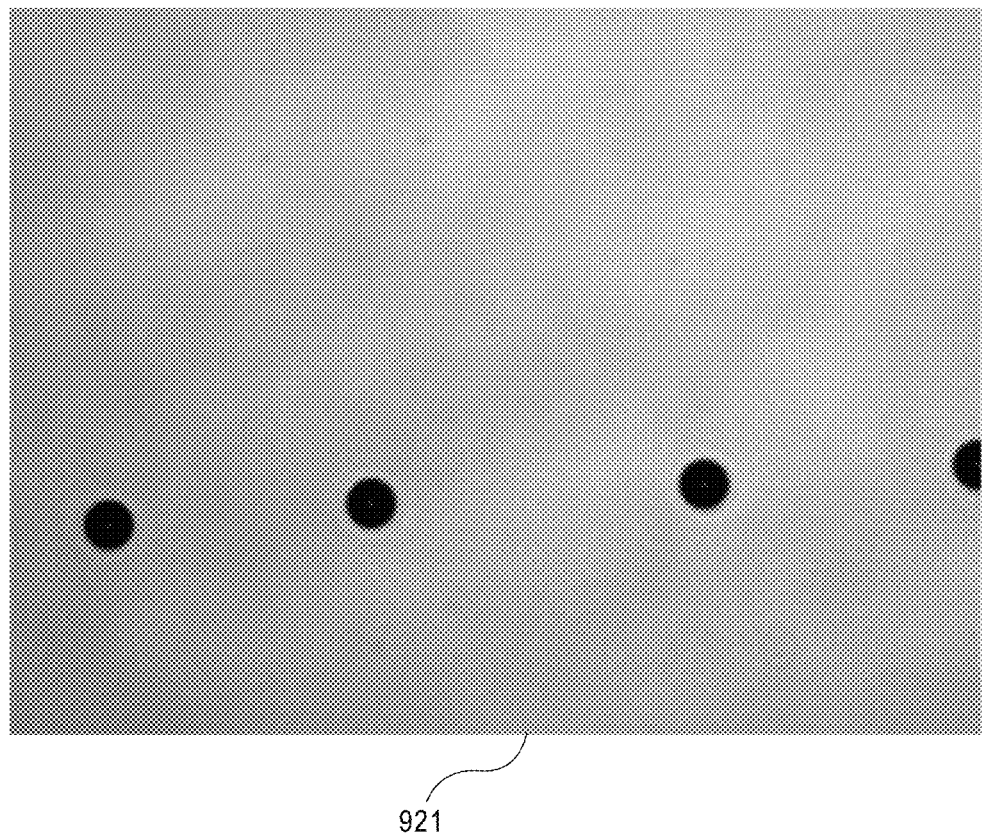
FIG. 9C is a view showing an image of monodisperse droplets generated using VCSEL illumination of the multi-beam imaging apparatus according to another embodiment.

FIG. 9C is a view 920 showing an image of monodisperse droplets 921 generated using VCSEL illumination of the multi-beam imaging apparatus according to another embodiment. This image was acquired with a lower background illumination than that of the image in FIG. 9B. As shown in FIG. 9C, the background lighting on the image 921 is the uniform gray lighting with no speckle or diffraction noise.

Figure 10:
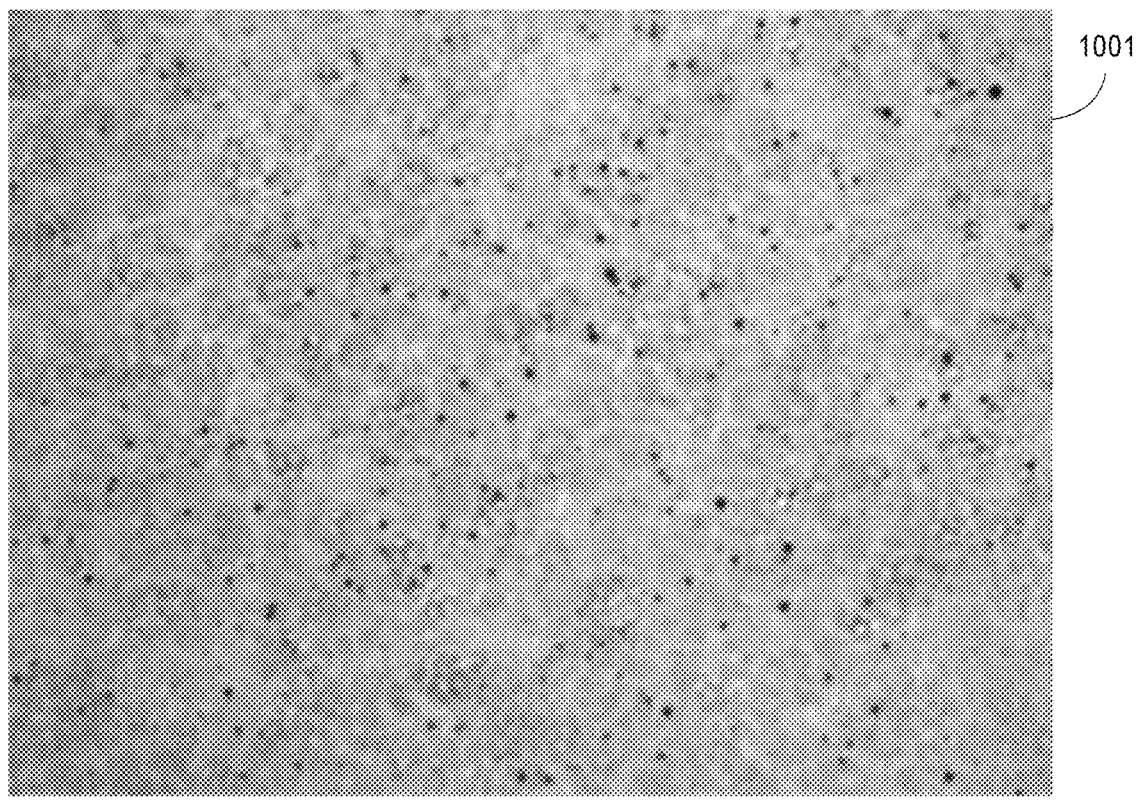
FIG. 10 is a view showing a dense spray image generated using VCSEL illumination of the multi-beam imaging apparatus according to one embodiment.

FIG. 10 is a view 1000 showing a dense spray image 1001 generated using VCSEL illumination of the multi-beam imaging apparatus according to one embodiment. Dense spray image 1001 shows the increased contracts between in focus particles (dark shadows) and the out-of-focus particles (gray background) comparing to the images generated using conventional light sources, as shown in FIGS. 11 and 12.

Figure 11:
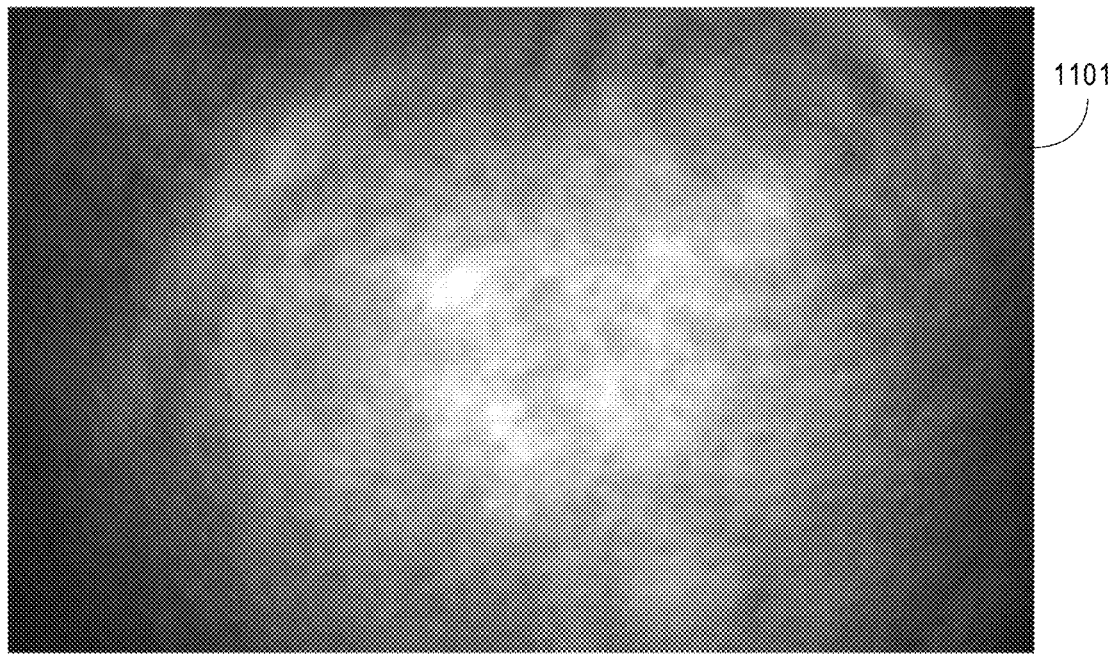
FIG. 11 is a view showing an image of a dilute particle field illuminated using the multi-beam diode lasers according to one embodiment.

FIG. 11 is a view 1100 showing an image of a dilute particle field 1101 illuminated using the multi-beam diode lasers according to one embodiment. In this image, one can observe the signature of speckle on the background that has been smoothened because of the multi-beam approach. The background light intensity distribution is not uniform, and local dispersion is fairly high that stresses the image processing methods and reduces the quality of the particle characterization results.

Figure 12:
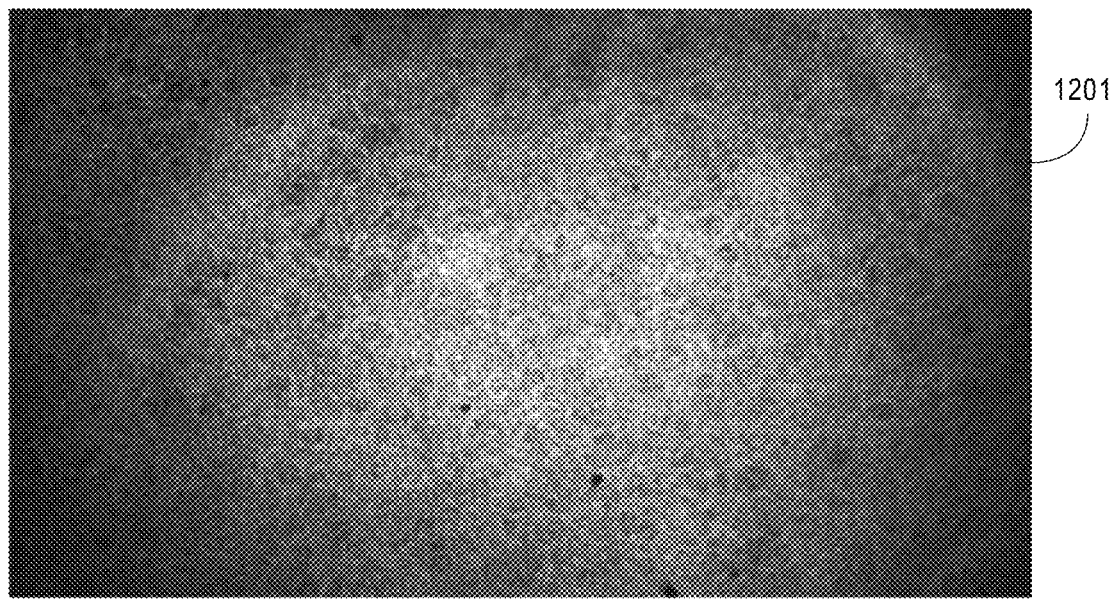
FIG. 12 is a view showing an image of a dense particle field 1201 illuminated using the multi-beam diode lasers according to one embodiment.

FIG. 12 is a view 1200 showing an image of a dense particle field 1201 illuminated using the multi-beam diode lasers according to one embodiment. As shown in FIG. 12, the background is much more chaotic than the background shown in FIG. 11, with larger disparity in intensity, even at the local level. This high level of scatter in the background illumination intensity comes from the multiple diffraction patterns produced by particles interfering with the beams, while they are out of the focal plane of the imaging system. The speckle and diffraction increase errors for the software in identifying and measuring the particles images.

Figure 13:
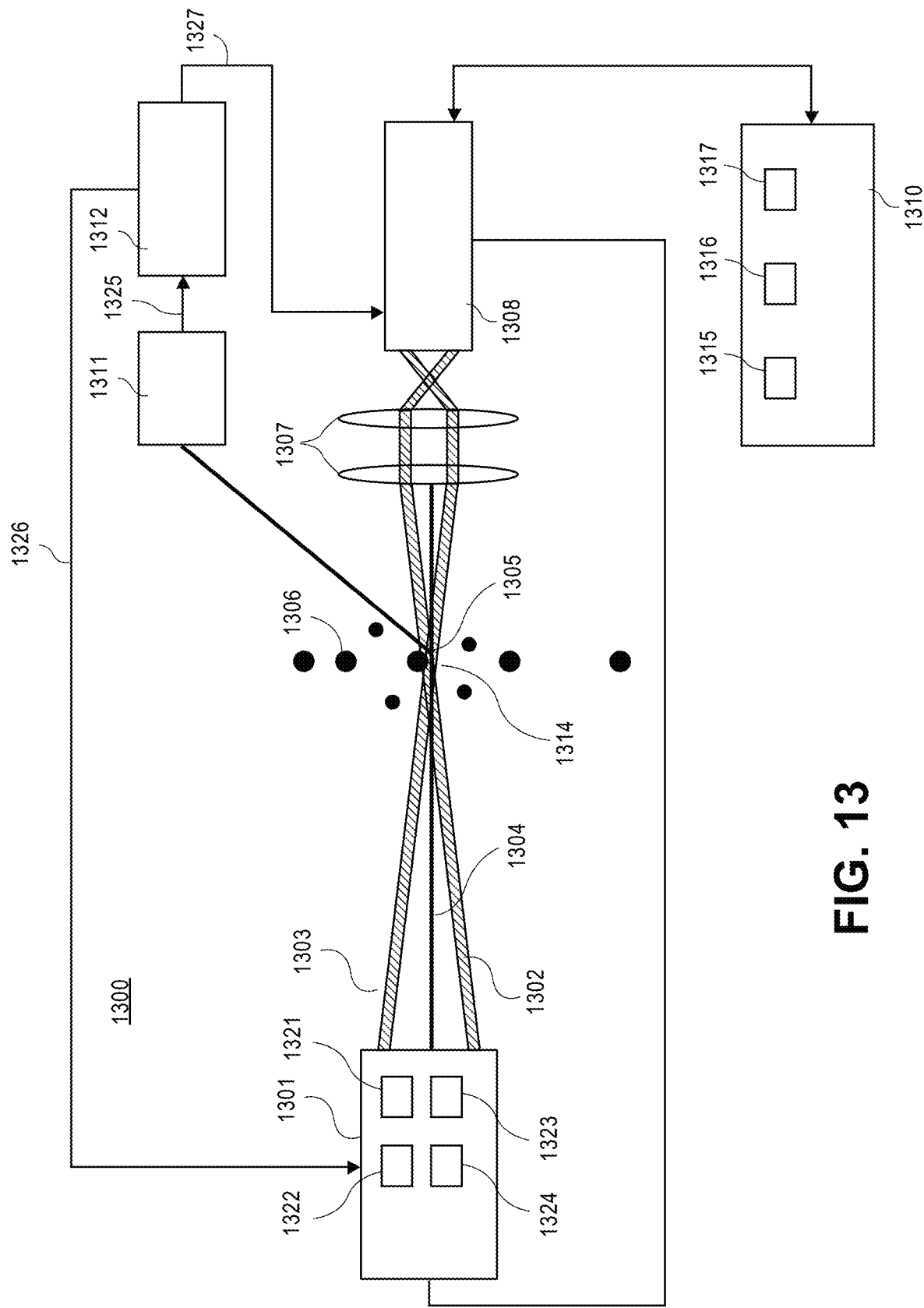
FIG. 13 is a view showing another embodiment of a system to image particles.

FIG. 13 is a view showing another embodiment of a system 1300 to image particles. System 1300 comprises a transmitter system 1301. Transmitter system 1301 comprises one or more light sources—e.g., a VCSEL source 1321 and a VCSEL source 1322—generating a plurality of illuminating light beams, such as light beams 1302 and 1303. For one embodiment, each of the VCSEL sources 1321 and 1322 represents one of the VCSEL sources described above. Transmitter system 1301 includes a light source 1323 to generate a triggering light beam 1304. The transmitter system 1301 comprises a synchronization module 1324 to synchronize the illuminating light beams with a digital camera system 1308. The illuminating light beams are configured to propagate on multiple optical paths through a particle field comprising particles—e.g., particles 1305 and 1306. The illuminating light beams are configured to converge to form a measurement volume 1314 at a focal plane of the imaging system. The illuminating light beams of FIG. 13 are represented by the illuminating light beams of FIGS. 1, 2 and 3. For an embodiment, the illuminating light sources of the transmitter system 301 comprise VCSELs, light emitting diodes ("LEDs"), or both, as described above. For an embodiment, the plurality of illuminating light beams are generated by one or more VCSEL arrays.

For an embodiment, the triggering light beam 1304 generated by the triggering light source propagates through a center of the measurement volume 1314. For an embodiment, the triggering light source comprises a laser (e.g. continuous wave CW diode laser, 432 nm), an LED, or both.

A receiver system comprises an imaging optics—e.g., one or more lenses 1307—and a digital camera system 1308 comprising one or more digital cameras to provide a shadow image of the particle passing through the measurement volume at a focal plane, as described above. For one embodiment, the wavelength of the triggering beam is different from the wavelength of the illuminating light beams. When a particle passes through the measurement volume, the particle scatters light from the trigger beam to the receiver with a photodetector system 1311 that outputs a trigger signal 1325 indicating the presence of the particle in the measurement volume 1314 to a logic circuitry 1312 to drive one or more laser sources. Logic circuitry 1312 outputs a trigger signal 1326 to drive one or more light sources of the transmitter system 1301 to generate converging illuminating light beams. Logic circuitry 1312 outputs a trigger signal 1325 to trigger digital camera system 1308. For one embodiment, multiple VCSEL lasers are used to simultaneously illuminate a particle field from multiple directions. A trigger laser and photodetector are used to detect the presence of particles in the measurement volume. This information is used to pulse the multiple illumination beams at the same instant to capture the image of the particle as it transits the sample volume. The camera shutter is opened for a longer period of time and the trigger beam outputs a signal to activate the illumination lasers (VCSEL's, LED's etc.). The laser beams are combined by a receiver lens which creates a frozen shadow (e.g., bright-field image) of the particles on the CMOS sensor. The use of multi-angle illumination significantly reduces measurement errors due to depth-of-field variations that are a problem for conventional instruments.

The imaging system can optionally comprise one or more beam splitters (not shown) to split the illuminating light beams onto multiple digital cameras, as described above with respect to FIG. 3. An image acquisition and processing system 1310 is coupled to the digital camera system 1308. Processing system 1310 comprises a processor 1315, a memory 1316, and a display 1317 to perform the methods, as described herein. For an embodiment, processor 1315 is configured to perform particle analysis that involves identifying particles that are in-focus, calculating various shape parameters, and classifying particles. For an embodiment, processor 1315 is configured to differentiate between liquid drops and ice crystals.

Figure 14:
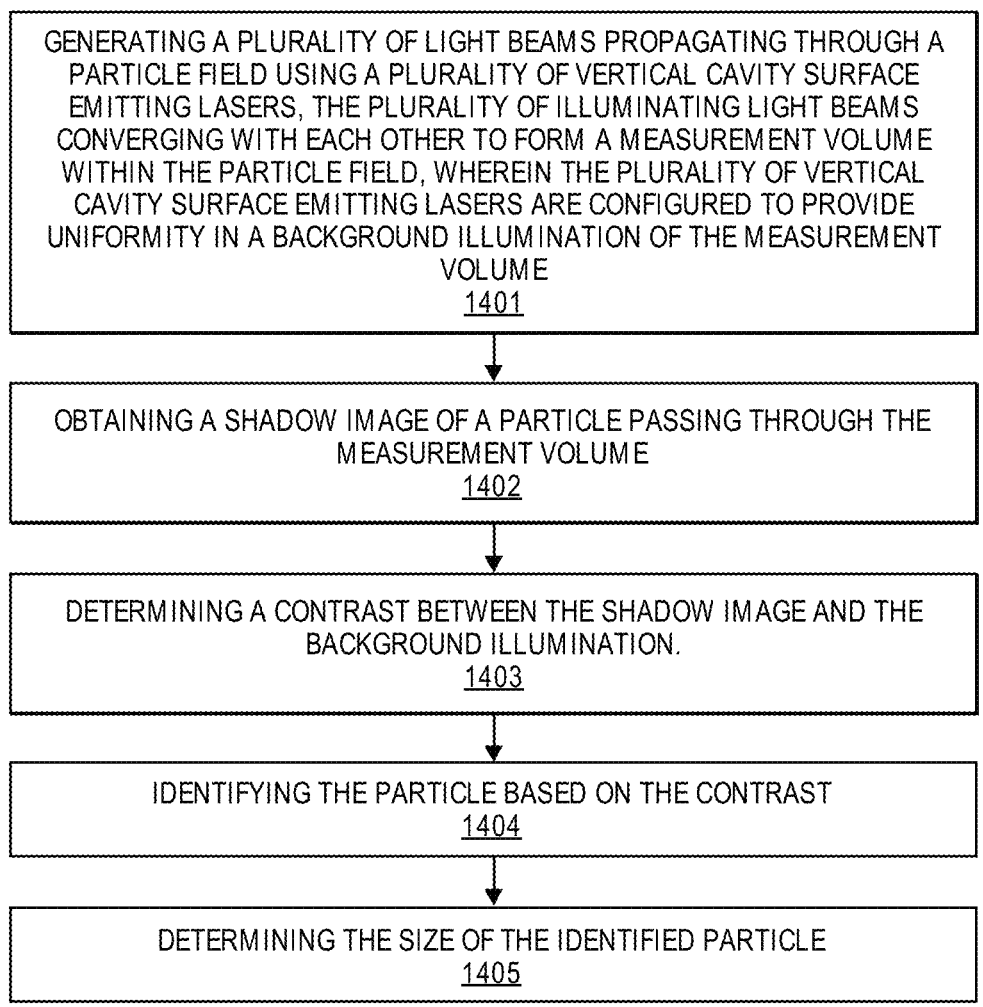
FIG. 14 shows a flow chart of a method to provide multi-beam imaging of particles according to one embodiment.

FIG. 14 shows a flow chart of a method 1400 to provide multi-beam imaging of particles according to one embodiment. At operation 1401 a plurality of light beams that converge with each other to form a measurement volume within a particle field are generated using a plurality of vertical cavity surface emitting lasers (VCSELs) to provide uniformity in a background illumination of the measurement volume, as described above. At operation 1402 a shadow image of a particle passing through the measurement volume at a focal plane of a digital camera is obtained. At operation 1403 a contrast between the obtained shadow image and the background illumination is determined. At operation 1404 the particle is identified based on the contrast. At operation 1405 the size of the identified particle is determined based on the shadow image, as described above.

FIG. 15 shows a flow chart of a method 1500 to provide multi-beam imaging of particles according to another embodiment. At operation 1501 a plurality of light beams that converge with each other to form a measurement volume within a particle field are generated using a plurality of VCSELs to provide uniformity in a background illumination of the measurement volume, as described above. At operation 1502 the uniformity of background illumination is monitored. For example, it is determined if a difference in the background illumination at different locations of the background area on the image is greater than a predetermined threshold. At operation 1503 an output beam of at least one of the VCSELs is adjusted based on monitoring. For example, one or more parameters (e.g., output light intensity, angle, pulse, a wavelength, or any combination thereof) of at least one of the VCSELs is adjusted to increase the uniformity of the background illumination, if the difference in the background illumination at different locations of the background area on the image is greater than the predetermined threshold. At operation 1504 a shadow image of the particle passing through the measurement volume at a focal plane of a digital camera is determined based on the adjusted background.

Figure 16A:
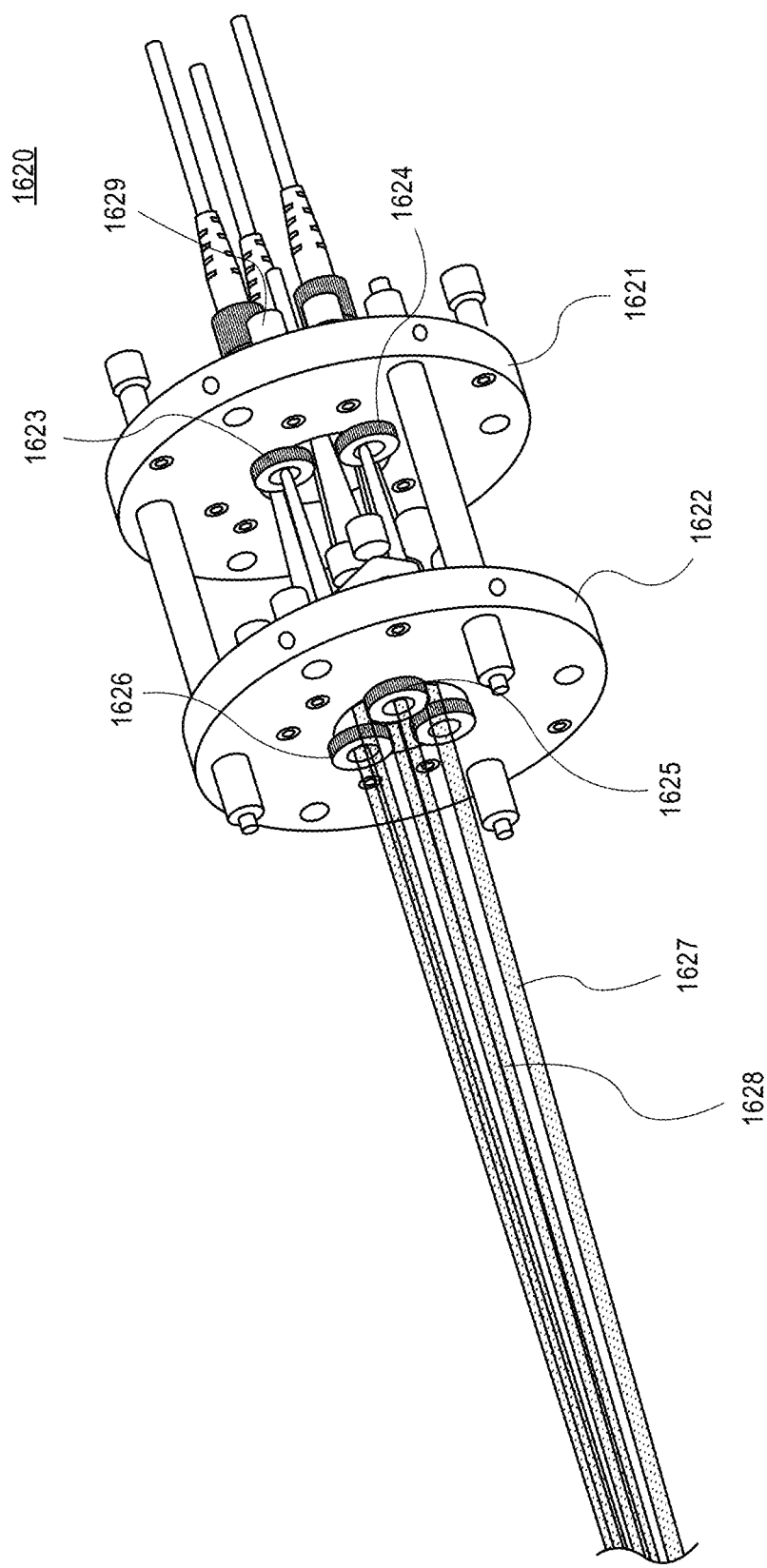
FIG. 16A illustrates one embodiment of a system to illuminate particles.

FIG. 16A illustrates one embodiment of an illumination system to image particles. A system 1620 comprises one or more mounting fixtures, such as a mounting fixture 1621 and a mounting fixture 1622. Mounting fixture 1621 holds a portion of a transmitter sub-system comprising a plurality of VCSEL sources, such as a VCSEL array 1623 and a VCSEL array 1624. Mounting fixture 1622 holds a portion of the transmitter sub-system comprising a plurality of VCSEL sources, such as a VCSEL source 1625 and a VCSEL source 1626. For one embodiment, each of the VCSEL sources 1625 and 1626 represents one of the VCSEL sources described above. Each of the VCSEL sources comprises one or more focusing lenses coupled to an output of the VCSEL array to form an illuminating laser beam. A plurality of illuminating laser beams, such as an illuminating laser beam 1627 and an illuminating laser beam 1628 are generated by the VCSEL sources that converge with each other to form a measurement volume within a particle field to provide uniformity in a background illumination associated with the measurement volume, as described above. For an embodiment, system 1600 comprises a receiver module (not shown) comprising an imaging optics to provide a shadow image of a particle passing through the measurement volume at a focal plane of the first digital camera, as described above.

Figure 16B:
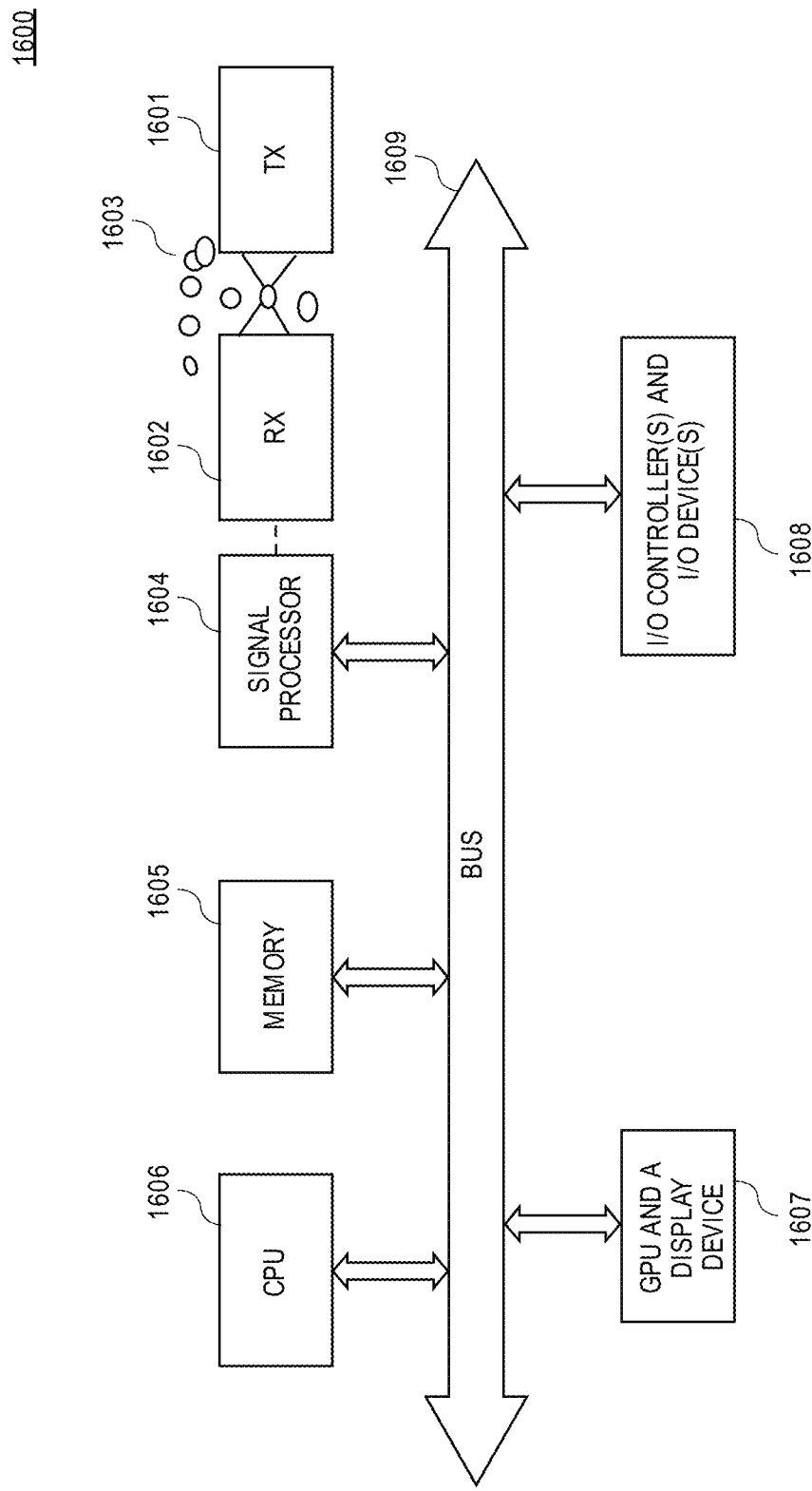
FIG. 16B illustrates one embodiment of a system to image particles.

FIG. 16B illustrates one embodiment of a system to image particles. As shown on FIG. 16B, system 1600 includes a transmitter 1601 including a plurality of VCSEL sources to generate illuminating light beams converging to form a measurement volume to illuminate particles 1603, as described above. As shown in FIG. 16B, a receiver 1602 is coupled to receive the shadows of particles 1603, as described above. As shown in FIG. 16B, receiver 1606 is coupled to a signal processor 1604. As shown in FIG. 16B, a subsystem 1606 comprising a central processing unit ("CPU"), a subsystem 1607 comprising a graphics processing unit ("GPU"), that may be coupled with a display device, one or more subsystems 1608 comprising one or more I/O controllers coupled to one or more I/O devices, a memory 1605 (comprising a volatile RAM, a ROM and a non-volatile memory (e.g., flash memory or a hard drive), or any combination thereof), and a signal processor 1604 comprising a microcontroller are coupled to a bus 1609. At least one of a subsystem 1606 and a signal processor 1604 are configured to perform methods as described above. Memory 1605 may be used to store data that when accessed by the data processing system, cause the data processing system to perform one or more methods to provide multi-beam imaging of particles, as described above.

In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. An apparatus to provide multi-beam imaging, comprising:
 a plurality of vertical cavity surface emitting lasers to generate a plurality of light beams that converge with each other to form a measurement volume within a particle field, wherein the plurality of vertical cavity surface emitting lasers are configured to provide uniformity in a background illumination associated with the measurement volume;
 an imaging optics coupled to at least one of the plurality of vertical cavity surface emitting lasers; and
 a digital camera coupled to the imaging optics to obtain a first shadow image of a first particle passing through the measurement volume at a focal plane of the digital camera, wherein an intersection angle of the plurality of light beams is adjusted to remove shadow images of other particles outside the measurement volume; and
 a processor coupled to the digital camera.

2. The apparatus of claim 1, wherein a contrast between the first shadow image and the background illumination is greater than a contrast between a second shadow image of a second particle outside the focal plane and the background illumination.

3. The apparatus of claim 1, wherein each of the plurality of light beams is generated by at least two vertical cavity surface emitting lasers.

4. The apparatus of claim 1, wherein the plurality of vertical cavity surface emitting lasers comprises at least six vertical cavity surface emitting lasers.

5. The apparatus of claim 1, wherein the plurality of vertical cavity surface emitting lasers are configured to generate the same wavelength.

6. The apparatus of claim 1, wherein each of the plurality of light beams has a beam divergence angle that is not greater than 7 degrees.

7. The apparatus of claim 1, wherein an output power of the plurality of vertical cavity surface emitting lasers is at least 750 mW.

8. The apparatus of claim 1, wherein processor is configured to monitor the background illumination, wherein the processor is configured to adjust an intensity of at least one of the plurality of vertical cavity surface emitting lasers based on the monitored background illumination to obtain the first shadow image.

9. The apparatus of claim 1, wherein the processor is configured to determine the first shadow image from the background illumination, wherein the processor is configured to identify the first particle based on the first shadow image, and wherein the processor is configured to determine a size of the identified first particle based on the first shadow image.

10. The apparatus of claim 1, wherein at least one of the plurality of vertical cavity surface emitting lasers is configured to generate a pulsed beam.

11. The apparatus of claim 1, wherein the background illumination is free of speckles and diffraction patterns.

12. The apparatus of claim 1, wherein at least some of the plurality of vertical cavity surface emitting lasers are a part of a vertical cavity surface emitting laser array.

13. The apparatus of claim 1, wherein at least some of the plurality of vertical cavity surface emitting lasers are arranged in a circular pattern.

14. The apparatus of claim 1, further comprising a trigger light source coupled to the plurality of vertical cavity surface emitting lasers.

15. A method to provide multi-beam imaging of particles, comprising:
generating a plurality of light beams that converge with each other to form a measurement volume within a particle field using a plurality of vertical cavity surface emitting lasers that are configured to provide uniformity in a background illumination of the measurement volume; and
obtaining, by a digital camera, a first shadow image of a first particle passing through the measurement volume at a focal plane of a digital camera, wherein an intersection angle of the plurality of light beams is adjusted to remove shadow images of other particles outside the measurement volume.

16. The method of claim 15, further comprising:
generating a second shadow image of a second particle outside the focal plane.

17. The method of claim 15, further comprising:
determining a contrast between the first shadow image and the background illumination.

18. The method of claim 15, wherein each of the plurality of light beams is generated by at least two vertical cavity surface emitting lasers.

19. The method of claim 15, wherein the plurality of vertical cavity surface emitting lasers are configured to generate the same wavelength.

20. The method of claim 15, further comprising:
monitoring the background illumination; and
adjusting at least one of the plurality of vertical cavity surface emitting lasers based on the monitored background illumination to obtain the first shadow image.

21. The method of claim 15, further comprising:
determining the first shadow image from the background illumination;
identifying the first particle based on the first shadow image; and
determining a size of the identified first particle based on the first shadow image.

22. The method of claim 15, further comprising
sending a trigger signal to the plurality of vertical cavity surface emitting lasers.

23. A non-transitory machine-readable medium comprising data that when accessed by a data processing system, cause the data processing system to perform a method to image particles comprising:
generating a plurality of light beams converging with each other to form a measurement volume within a particle field using a plurality of vertical cavity surface emitting lasers that are configured to provide uniformity in a background illumination of the measurement volume; and
obtaining, by a digital camera, a first shadow image of a first particle passing through the measurement volume at a focal plane of the digital camera, wherein an intersection angle of the plurality of light beams is adjusted to remove shadow images of other particles outside the measurement volume.

24. The non-transitory machine-readable medium of claim 23, further comprising instructions to cause the data processing system to perform operations comprising:
generating a second shadow image of a second particle outside the focal plane.

25. The non-transitory machine-readable medium of claim 23, further comprising instructions to cause the data processing system to perform operations comprising:
determining a contrast between the first shadow image and the background illumination.

26. The non-transitory machine-readable medium of claim 23, wherein each of the plurality of light beams is generated by at least two vertical cavity surface emitting lasers.

27. The non-transitory machine-readable medium of claim 23, further comprising instructions to cause the data processing system to perform operations comprising:
monitoring the background illumination; and
adjusting an intensity of at least one of the plurality of vertical cavity surface emitting lasers based on the monitored background illumination to obtain the first shadow image.

28. The non-transitory machine-readable medium of claim 23, further comprising instructions to cause the data processing system to perform operations comprising:
determining the first shadow image from the background illumination; identifying the first particle based on the first shadow image; and determining a size of the identified first particle based on the first shadow image.

29. The non-transitory machine-readable medium of claim 23, further comprising instructions to cause the data processing system to perform operations comprising:
sending a trigger signal to the plurality of vertical cavity surface emitting lasers.

* * * * *